(12) United States Patent
Negishi et al.

(10) Patent No.: US 10,367,153 B2
(45) Date of Patent: Jul. 30, 2019

(54) PHOTOELECTRIC CONVERSION FILM, SOLID STATE IMAGING ELEMENT, AND ELECTRONIC DEVICE

(71) Applicant: SONY SEMICONDUCTOR SOLUTIONS CORPORATION, Kanagawa (JP)

(72) Inventors: Yuki Negishi, Kanagawa (JP); Osamu Enoki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 19 days.

(21) Appl. No.: 15/546,272

(22) PCT Filed: Jan. 5, 2016

(86) PCT No.: PCT/JP2016/050156
§ 371 (c)(1),
(2) Date: Jul. 25, 2017

(87) PCT Pub. No.: WO2016/129298
PCT Pub. Date: Aug. 18, 2016

(65) Prior Publication Data
US 2018/0342683 A1 Nov. 29, 2018

(30) Foreign Application Priority Data
Feb. 12, 2015 (JP) .................. 2015-025136

(51) Int. Cl.
*C09B 47/00* (2006.01)
*H01L 27/30* (2006.01)
(Continued)

(52) U.S. Cl.
CPC .......... *H01L 51/0078* (2013.01); *C09B 47/00* (2013.01); *H01L 27/146* (2013.01);
(Continued)

(58) Field of Classification Search
CPC ....... H01L 51/078; H01L 27/307; H01L 1/10; H01L 51/0078; H01L 27/146;
(Continued)

(56) References Cited

U.S. PATENT DOCUMENTS 9,252,371 B1 * 2/2016 Yagi ...................... H01L 51/008
9,490,442 B2 * 11/2016 Leem ........................ C07F 5/02
9,673,259 B2 * 6/2017 Park ...................... H01L 27/307

OTHER PUBLICATIONS

"Synthesis of Subphthalocyanine in which Trifluoromethyl Group is Introduced", Japan Society of Colour Material, Oct. 2014, 04 pages.
(Continued)

*Primary Examiner* — Jasmine J Clark
(74) *Attorney, Agent, or Firm* — Chip Law Group

(57) ABSTRACT

Provided is a photoelectric conversion film containing a subphthalocyanine derivative represented by general formula (1) below, general formula (1)

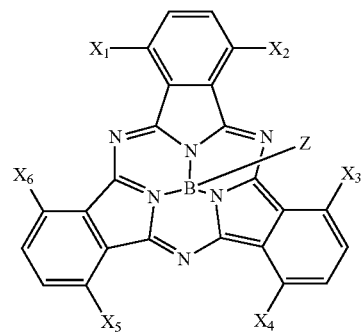

in which, in the general formula (1), at least one or more of $X_1$ and $X_2$, at least one or more of $X_3$ and $X_4$, and
(Continued)

at least one or more of $X_5$ and $X_6$ are a partial fluoroalkyl group substituted with two or more fluorine atoms or a perfluoroalkyl group, and Z is any substituent capable of binding to boron.

9 Claims, 7 Drawing Sheets

(51) Int. Cl.
  *H01L 31/10*    (2006.01)
  *H01L 51/00*    (2006.01)
  *H04N 5/232*    (2006.01)
  *H01L 27/146*    (2006.01)
  *H01L 51/42*    (2006.01)

(52) U.S. Cl.
  CPC .......... *H01L 31/10* (2013.01); *H01L 51/008* (2013.01); *H04N 5/23229* (2013.01); *H01L 27/14645* (2013.01); *H01L 27/14667* (2013.01); *H01L 27/307* (2013.01); *H01L 51/4253* (2013.01); *Y02E 10/549* (2013.01)

(58) Field of Classification Search
  CPC ......... H01L 27/14667; H01L 27/14645; H01L 31/10; H01L 51/008; H01L 51/4253; Y02E 10/549; C09B 47/00; H04N 5/23229
  See application file for complete search history.

(56) References Cited

OTHER PUBLICATIONS

Ken'ichiro Nagai, "Trifluoromethyl-Ki o Donyu shita SubPhthalocyanine no Gosei", 2014 Nendo Japan Society of Colour Material Conference Koen Yoshishu, Oct. 14, 2014, pp. 192 to 193.
Kwang-Hee Lee, "Green-Sensitive Organic Photodetectors with High Sensitivity and Spectral Selectivity Using Subphthalocyanine Derivatives" ACS Applied Materials & Interfaces, Nov. 25, 2013, vol. 5, Issue 24, pp. 13089-13095.
Graham E. Morse, "Experimentally Validated Model for the Prediction of the HOMO and LUMO Energy Levels of Boronsubphthalocyanines", The Journal of Physical Chemistry C, May 24, 2011, vol. 115, Issue 23, pp. 11709-11718.
International Search Report and Written Opinion of PCT Application No. PCT/JP2016/050156, dated Mar. 15, 2016, 02 pages of English Translation and 06 pages of ISRWO.

* cited by examiner

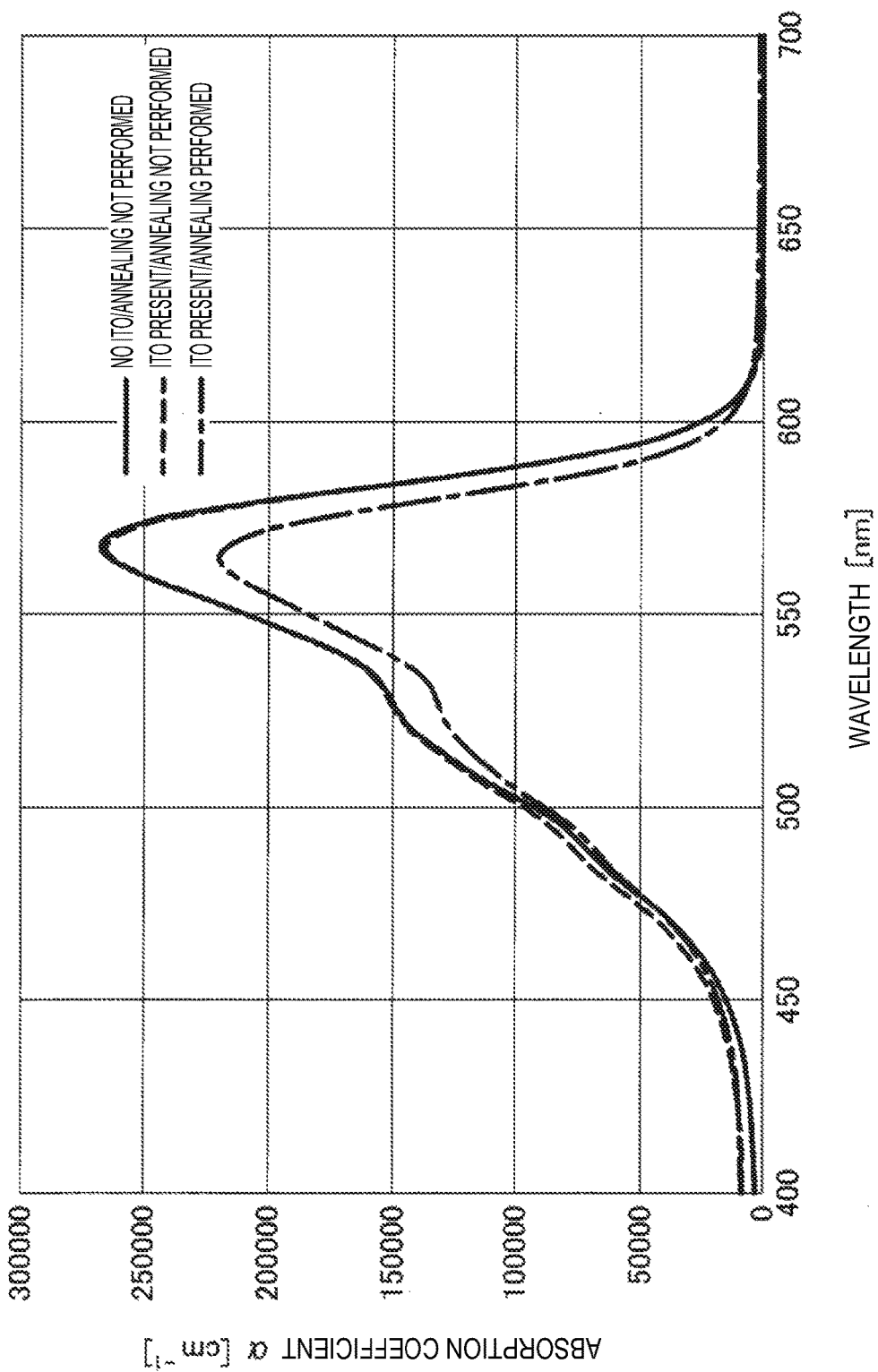

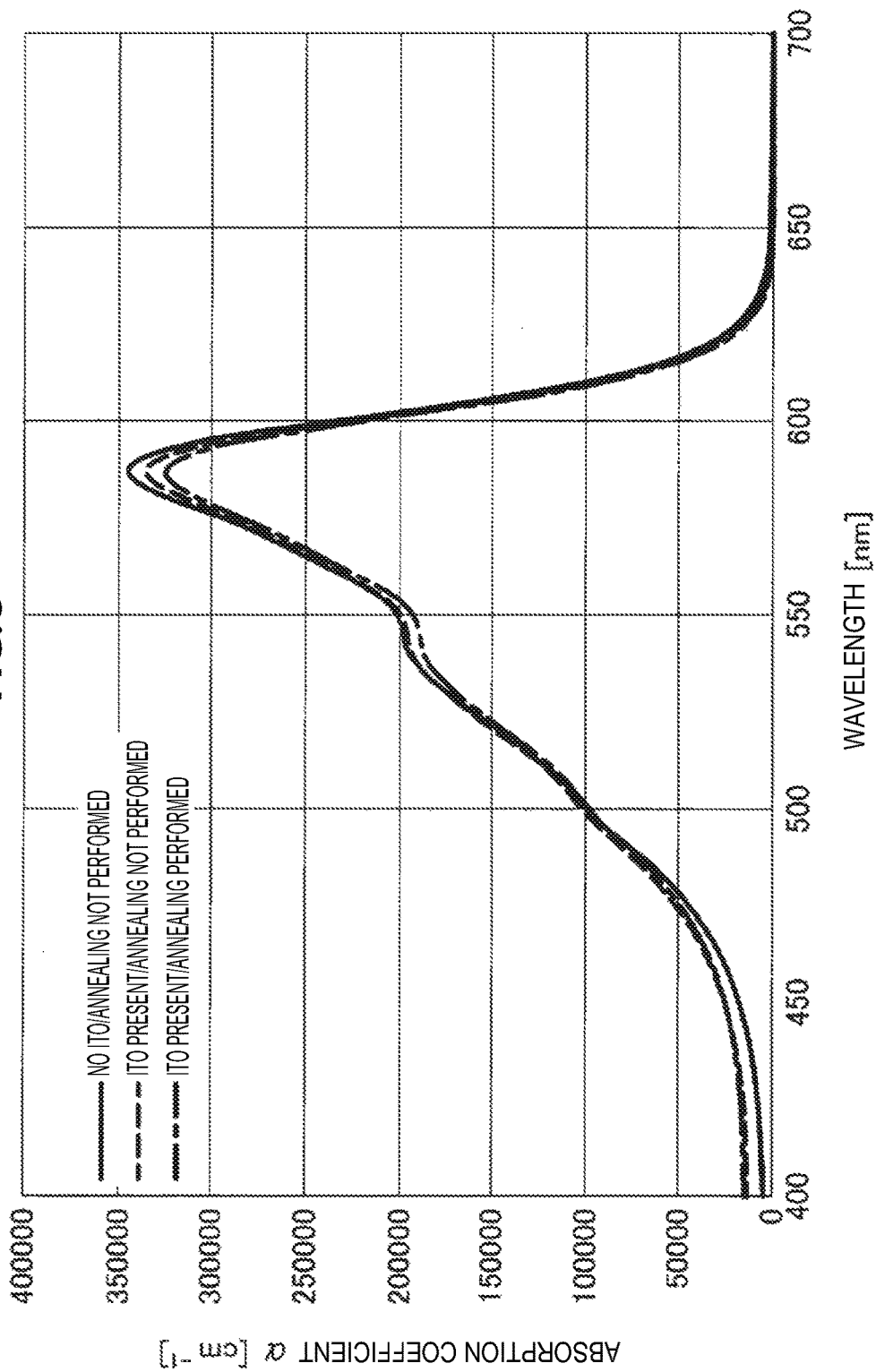

PHOTOELECTRIC CONVERSION FILM, SOLID STATE IMAGING ELEMENT, AND ELECTRONIC DEVICE

CROSS REFERENCE TO RELATED APPLICATIONS

This application is a U.S. National Phase of International Patent Application No. PCT/JP2016/050156 filed on Jan. 5, 2016, which claims priority benefit of Japanese Patent Application No. JP 2015-025136 filed in the Japan Patent Office on Feb. 12, 2015. Each of the above-referenced applications is hereby incorporated herein by reference in its entirety.

TECHNICAL FIELD

The present disclosure relates to a photoelectric conversion film, a solid state imaging element, and an electronic device.

BACKGROUND ART

These days, a vertical spectral solid state imaging element that uses a photoelectric conversion film containing an organic photoelectric conversion material to perform spectral analysis in the light incidence direction is proposed.

For example, a solid state imaging element in which organic photoelectric conversion films that absorb blue light, green light, and red light, respectively, are stacked, a solid state imaging element in which an organic photoelectric conversion film that absorbs green light and a plurality of silicon photodiodes are stacked, and the like are proposed.

In such solid state imaging elements, the area per pixel can be increased, and therefore it is expected that the sensitivity of the solid state imaging element can be improved.

Here, in an organic photoelectric conversion film in a solid state imaging element like the above, selective absorption of light in a specific wavelength range is required in order to improve imaging characteristics. For example, an organic photoelectric conversion film that absorbs green light is required to selectively absorb light in the wavelength range of more than or equal to 450 nm and less than or equal to 600 nm.

Further, subphthalocyanine derivatives disclosed in Patent Literature 1 below etc. are known as organic coloring material compounds that absorb green light.

CITATION LIST

Patent Literature

Patent Literature 1: JP 2011-140639A

DISCLOSURE OF INVENTION

Technical Problem

However, the subphthalocyanine derivatives disclosed in Patent Literature 1 etc. have large absorption of light in a wavelength range of more than 600 nm, and therefore have failed to have appropriate light absorption characteristics as an organic photoelectric conversion film of green light in a solid state imaging element. Thus, a subphthalocyanine derivative having little absorption in the wavelength range of more than 600 nm has been desired.

In the present disclosure, a new and improved photoelectric conversion film that has little absorption in a wavelength range of more than 600 nm and can improve the imaging characteristics of a solid state imaging element, a solid state imaging element including the photoelectric conversion film, and an electronic device including the solid state imaging element are proposed.

Solution to Problem

According to the present disclosure, there is provided a photoelectric conversion film including a subphthalocyanine derivative represented by general formula (1) below,

[Chem. 1]

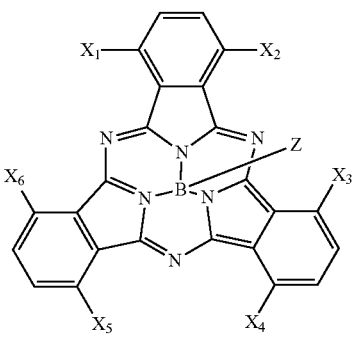

general formula (1)

in which, in the general formula (1), $X_1$ to $X_6$ are mutually independently hydrogen, a halogen, a hydroxy group, a thiol group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, or a substituted or unsubstituted heteroaryl group, Z is hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom, and at least one or more of the $X_1$ and the $X_2$, at least one or more of the $X_3$ and the $X_4$, and at least one or more of the $X_5$ and the $X_6$ are a substituent represented by general formula (2) below,

[Chem. 2]

general formula (2)

in which, in the general formula (2), $R_1$ to $R_3$ are mutually independently hydrogen, a halogen, a hydroxy group, an alkoxy group, a cyano group, a nitro group, a sulfonyl group, an amino group, an acyl group, a carboxy group, or a substituted or unsubstituted alkyl group, and at least two or more of the $R_1$ to the $R_3$ are fluorine.

Further, according to the present disclosure, there is provided a solid state imaging element including: a photoelectric conversion film containing a subphthalocyanine derivative represented by general formula (1) above.

Further, according to the present disclosure, there is provided an electronic device including: a solid state imaging element including a photoelectric conversion film containing a subphthalocyanine derivative represented by general formula (1) above.

According to the present disclosure, a subphthalocyanine derivative that has little absorption of light in a wavelength range of more than 600 nm and can selectively absorb light in the wavelength range of more than or equal to 450 nm and less than or equal to 600 nm is provided. Therefore, a photoelectric conversion film using a subphthalocyanine derivative according to the present disclosure can selectively absorb green light of more than or equal to 450 nm and less than or equal to 600 nm, and can thus be suitably used for a solid state imaging element.

Advantageous Effects of Invention

As described above, according to the present disclosure, the imaging characteristics of a solid state imaging element can be improved.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 2B is a graph showing the results of evaluation of spectral characteristic change of Example 5.

FIG. 3 is a graph showing the results of evaluation of spectral characteristic change of Comparative Example 4.

MODE(S) FOR CARRYING OUT THE INVENTION

Figure 1:
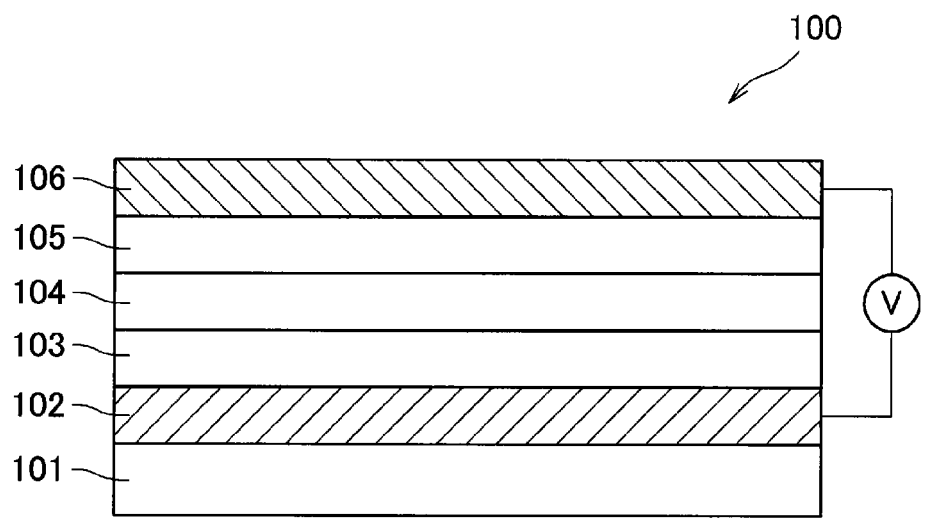
FIG. 1 is a schematic diagram showing an example of the photoelectric conversion element using a photoelectric conversion film according to an embodiment of the present invention.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

In addition, the description is given in the following order.
1. Embodiment of present disclosure
1.1. Photoelectric conversion film according to present embodiment
1.2. Photoelectric conversion element using photoelectric conversion film according to present embodiment
1.3. Examples
2. Examples of use of photoelectric conversion film according to present embodiment
2.1. Solid state imaging element
2.2. Electronic device
3. Conclusions
<1. Embodiment of Present Disclosure>
[1.1. Photoelectric Conversion Film According to Present Embodiment]

First, a photoelectric conversion film according to an embodiment of the present disclosure is described. The photoelectric conversion film according to the present embodiment has the light absorption characteristic of little absorption of light in a wavelength range of more than 600 nm.

Here, the light absorption characteristics in an organic thin film are determined in dependence on the characteristics of the molecules themselves constituting the organic thin film, the molecular orientation during the formation of the organic thin film, etc. In the photoelectric conversion film according to the present embodiment, a specific substituent is introduced into a subphthalocyanine derivative contained in the photoelectric conversion film, and thereby a maximum absorption wavelength of the subphthalocyanine derivative is shifted to the short wavelength side; thus, the absorption of light in a wavelength range of more than 600 nm can be reduced.

Such a photoelectric conversion film according to the present embodiment contains a subphthalocyanine derivative represented by general formula (1) below.

[Chem. 3]

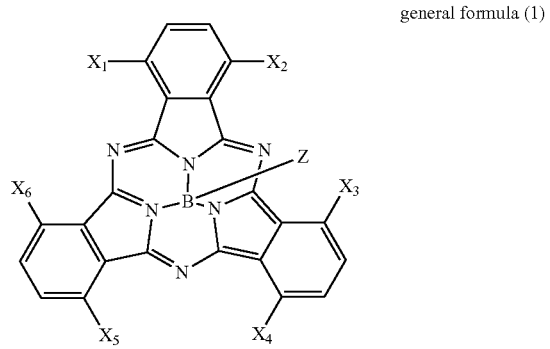

general formula (1)

Here, in general formula (1), $X_1$ to $X_6$ are mutually independently hydrogen, a halogen, a hydroxy group, a thiol group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, or a substituted or unsubstituted heteroaryl group, and Z is hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom.

That is, the subphthalocyanine derivative represented by general formula (1) has a structure in which a hydrogen atom in each terminal benzene ring of the subphthalocyanine skeleton on the side near to the one side shared with the condensed ring (hereinafter, occasionally referred to as a Bay position) is substituted with any of substituents $X_1$ to $X_6$.

Further, at least one or more of $X_1$ and $X_2$, at least one or more of $X_3$ and $X_4$, and at least one or more of $X_5$ and $X_6$ are a substituent represented by general formula (2) below.

[Chem. 4]

general formula (2)

Here, in general formula (2), $R_1$ to $R_3$ are mutually independently hydrogen, a halogen, a hydroxy group, an alkoxy group, a cyano group, a nitro group, a sulfonyl group, an amino group, an acyl group, a carboxy group, or a substituted or unsubstituted alkyl group, and at least two or more of $R_1$ to $R_3$ are fluorine.

For example, specific examples of the substituent represented by general formula (2) include a difluoromethyl group, a trifluoromethyl group, and the like.

In a case where the number of fluorine atoms occupying $R_1$ to $R_3$ is 1 or less, the maximum absorption wavelength of a subphthalocyanine derivative substituted with a substituent represented by general formula (2) is not shifted to the short wavelength side. Hence, it is necessary that at least two or more of $R_1$ to $R_3$ be fluorine. Further, if at least two or more of $R_1$ to $R_3$ are fluorine, the other one of $R_1$ to $R_3$ is not particularly limited, and may be any atom or substituent.

However, it is preferable that all of $R_1$ to $R_3$ be fluorine. That is, the substituent represented by general formula (2) is preferably a trifluoromethyl group. In such a case, as shown by Examples described later, the maximum absorption wavelength of the subphthalocyanine derivative can be shifted further to the short wavelength side, and therefore the absorption of light in the wavelength range of more than 600 nm can be made still smaller.

By the substitution with at least one or more substituents represented by general formula (2) above in each terminal benzene ring, the subphthalocyanine derivative represented by general formula (1) can shift the maximum absorption wavelength to the short wavelength side. Thereby, in the subphthalocyanine derivative represented by general formula (1), the absorption of light in a wavelength range of more than 600 nm is reduced, and therefore light in the wavelength range of more than or equal to 450 nm and less than or equal to 600 nm can be selectively absorbed.

Here, in general formula (1), $X_1$ to $X_6$ may be substituted with a substituent represented by general formula (2) so that the subphthalocyanine derivative represented by general formula (1) has symmetry, or may be substituted with a substituent represented by general formula (2) so that the subphthalocyanine derivative represented by general formula (1) does not have symmetry. Specifically, $X_1$, $X_3$, and $X_5$ (or $X_2$, $X_4$, and $X_6$) may be substituted with a substituent represented by general formula (2) so that the subphthalocyanine derivative represented by general formula (1) has symmetry. Further, $X_1$, $X_3$, and $X_6$ (or $X_1$, $X_4$, and $X_6$) may be substituted with a substituent represented by general formula (2) so that the subphthalocyanine derivative represented by general formula (1) does not have symmetry.

Further, it is more preferable that all of $X_1$ to $X_6$ be substituted with a substituent represented by general formula (2). In such a case, as shown by Examples described later, the maximum absorption wavelength of the subphthalocyanine derivative can be shifted further to the short wavelength side, and therefore the absorption of light in the wavelength range of more than 600 nm can be made still smaller.

In general formula (1), Z may be any substituent capable of binding to boron. Z may be, for example as described above, hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom. More specifically, Z may be a halogen, a hydroxy group, or a substituted or unsubstituted alkoxy group. Here, in a case where Z is a subphthalocyanine derivative linked via an oxygen atom, the subphthalocyanine derivative represented by general formula (1) is what is called a μ-oxo-crosslinked subphthalocyanine dimer. In addition, in such a case, the μ-oxo-crosslinked subphthalocyanine derivatives may be the same structure, or may be different structures.

Specific examples of the subphthalocyanine derivative represented by general formula (1) described above include the compounds of the structural formulae shown below. However, the subphthalocyanine derivative represented by general formula (1) is not limited to the following compounds.

[Chem. 5]
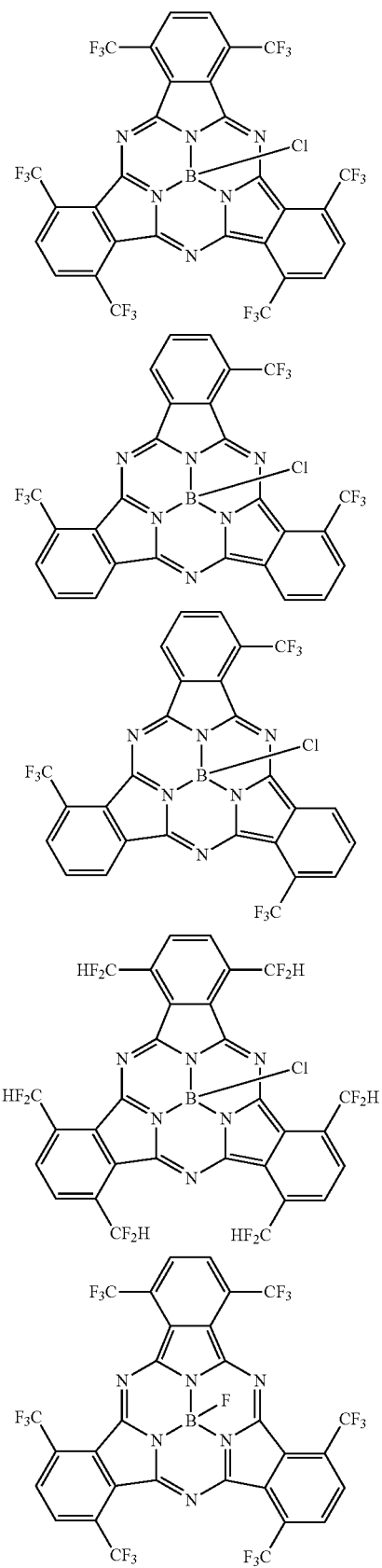
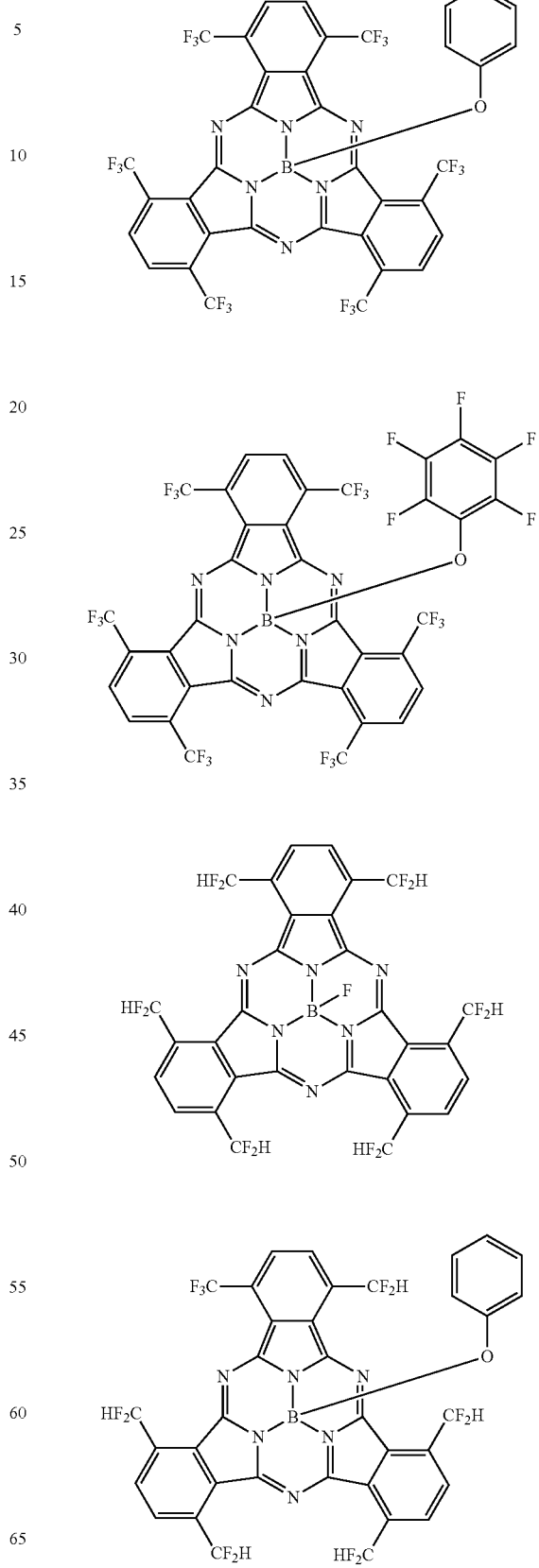

-continued

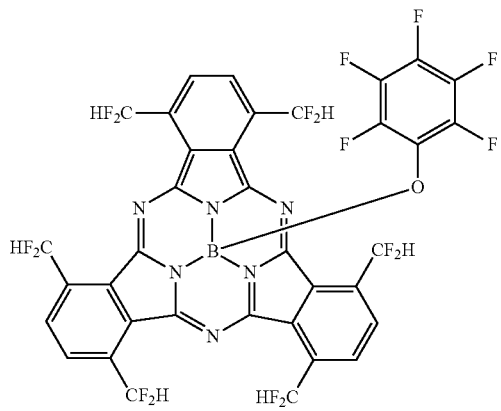

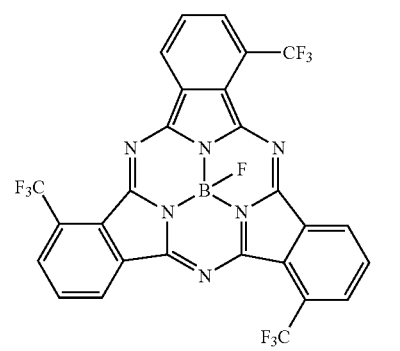

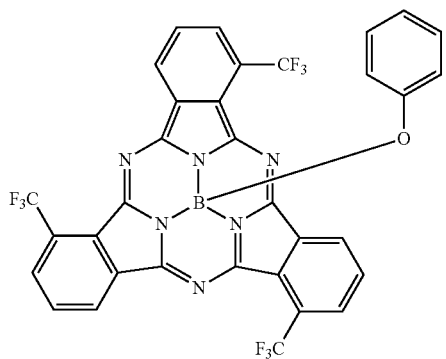

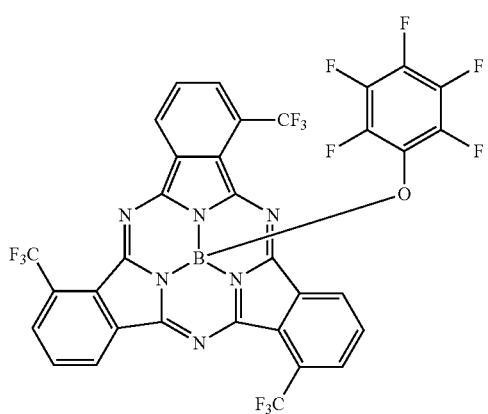

-continued

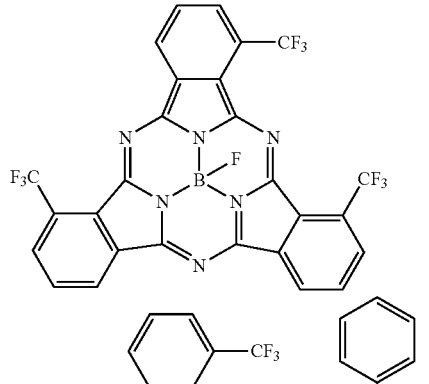

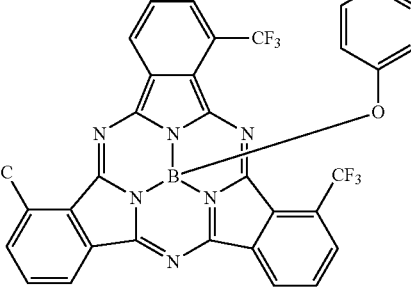

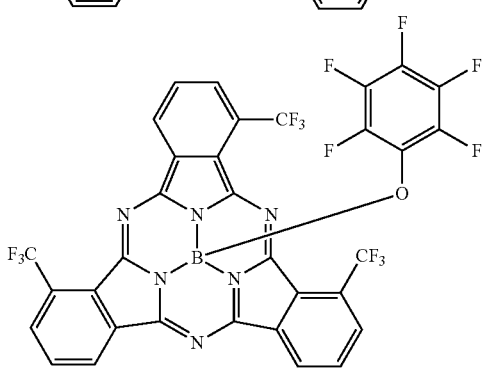

In addition, the photoelectric conversion film according to the present embodiment is preferably formed as a bulk hetero-film. The bulk hetero-film is a film in which one of the different compounds forming the film (for example, a p-type photoelectric conversion material and an n-type photoelectric conversion material) is in a crystalline fine particle state and the other is in an amorphous state, and thereby a fine structure in which an amorphous layer uniformly covers the surface of a crystal fine particle is formed. In such a bulk hetero-film, the area of a p-n junction that induces charge separation is increased by the fine structure; therefore, charge separation can be induced with better efficiency, and the photoelectric conversion efficiency can be improved.

More preferable photoelectric conversion characteristics can be obtained by the photoelectric conversion film according to the present embodiment being formed as a bulk hetero-film of a subphthalocyanine derivative represented by general formula (1) described above and an arbitrary photoelectric conversion material. For example, the photoelectric conversion film according to the present embodiment may be formed as a bulk hetero-film of a subphthalocyanine derivative represented by general formula (1) described above and a p-type photoelectric conversion material such as a quinacridone derivative.

As described above, the photoelectric conversion film according to the present embodiment contains a subphthalocyanine derivative represented by general formula (1) in which a maximum absorption wavelength is shifted to the short wavelength side and the absorption of light in a wavelength range of more than 600 nm is reduced. Thereby, the photoelectric conversion film according to the present embodiment can selectively absorb light in the wavelength range of more than or equal to 450 nm and less than or equal to 600 nm, and can therefore be suitably used as an organic photoelectric conversion film of green light in a solid state imaging element. Thus, by the present embodiment, the imaging characteristics of a solid state imaging element can be improved.

[1.2. Photoelectric Conversion Element Using Photoelectric Conversion Film According to Present Embodiment]

Next, a photoelectric conversion element 100 using a photoelectric conversion film according to the present embodiment is described with reference to FIG. 1. FIG. 1 is a schematic diagram showing an example of the photoelectric conversion element using a photoelectric conversion film according to the present embodiment.

As shown in FIG. 1, the photoelectric conversion element 100 includes a substrate 101, a lower electrode 102 placed on the substrate 101, a p-buffer layer 103 placed on the lower electrode 102, a photoelectric conversion film 104 placed on the p-buffer layer 103, an n-buffer layer 105 placed on the photoelectric conversion film 104, and an upper electrode 106 placed on the n-buffer layer 105.

In addition, the structure of the photoelectric conversion element 100 shown in FIG. 1 is only an example, and the structure of the photoelectric conversion element 100 using a photoelectric conversion film according to the present embodiment is not limited to the structure shown in FIG. 1. For example, either one or more of the p-buffer layer 103 and the n-buffer layer 105 may be omitted.

Further, an electron blocking layer containing an electron donating material may be provided between the lower electrode 102 and the p-buffer layer 103, and a hole blocking layer containing an electron accepting material may be provided between the n-buffer layer 105 and the upper electrode 106. In addition, known materials may be used as the electron accepting and donating material and the electron accepting material.

The substrate 101 is a support body on which the layers constituting the photoelectric conversion element 100 are arranged to be stacked. As the substrate 101, those used in common photoelectric conversion elements may be used. For example, the substrate 101 may be various glass substrates such as a high strain point glass substrate, a soda glass substrate, and a borosilicate glass substrate, a quartz substrate, a semiconductor substrate, a plastic substrate of polymethyl methacrylate, polyvinyl alcohol, a polyimide, a polycarbonate, or the like, etc. In addition, in a case where incident light is allowed to be transmitted to the opposite side of the element in the photoelectric conversion element 100, the substrate 101 is preferably configured with a transparent material.

The lower electrode 102 and the upper electrode 106 are configured with an electrically conductive material such as a metal or a metal oxide. The lower electrode 102 is placed on the substrate 101, and the upper electrode 106 is placed on the n-buffer layer 105. Specifically, at least either one of the lower electrode 102 and the upper electrode 106 is configured with a transparent electrically conductive material such as indium tin oxide (ITO). In addition, in a case where incident light is allowed to be transmitted to the opposite side of the element in the photoelectric conversion element 100, it is preferable that both of the lower electrode 102 and the upper electrode 106 be configured with a transparent electrically conductive material such as ITO.

As the transparent electrically conductive material, a tin oxide-based material in which tin oxide ($SnO_2$) or a dopant is added or a zinc oxide-based material in which zinc oxide (ZnO) or a dopant is added may be used. Examples of the zinc oxide-based material include an aluminum zinc oxide in which aluminum (Al) is added as a dopant, a gallium zinc oxide in which gallium (Ga) is added, and an indium zinc oxide in which indium (In) is added. Further, other than these, CuI, $InSbO_4$, ZnMgO, $CuInO_2$, $MgIn_2O_4$, $ZnSnO_3$, or the like may be used as the transparent electrically conductive material. Furthermore, indium gallium zinc oxide, indium gallium oxide, aluminum gallium zinc oxide, graphene, a metal thin film, and polyethylenedioxythiophene (PEDOT) may be used as the transparent electrically conductive material.

Figure 2A:
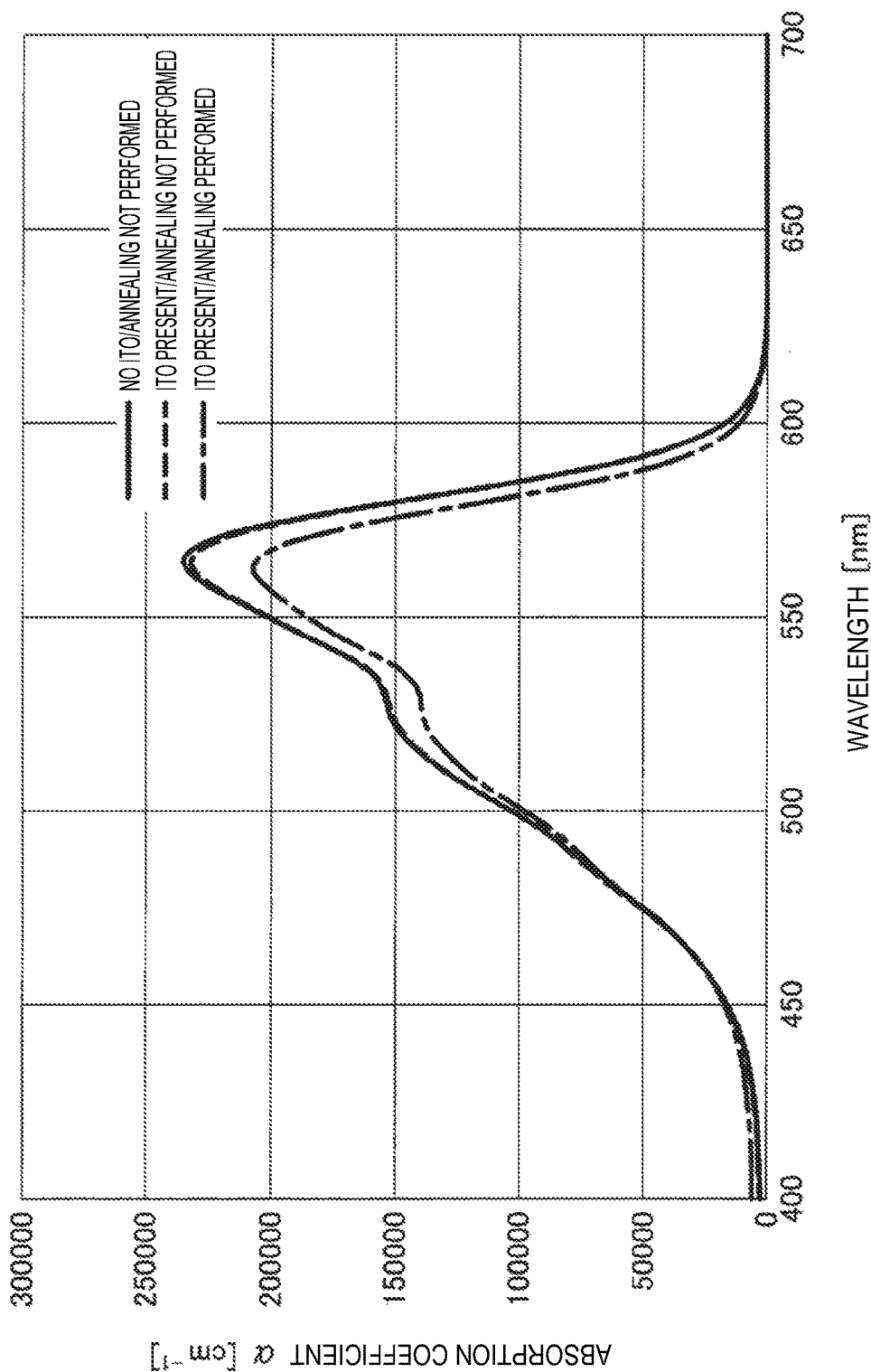
FIG. 2A is a graph showing the results of evaluation of spectral characteristic change of Example 4.

Further, a bias voltage is applied to the lower electrode 102 and the upper electrode 106. The polarity of the bias voltage is set so that, of the charge generated in the photoelectric conversion film 104, electrons move to the upper electrode 106 and holes move to the lower electrode 102, for example. In addition, it goes without saying that the polarity of the bias voltage may also be set so that, of the charge generated in the photoelectric conversion film 104, holes move to the upper electrode 106 and electrons move to the lower electrode 102. In such a case, the positions of the p-buffer layer 103 and the n-buffer layer 105 in the photoelectric conversion element 100 shown in FIGS. 2A and 2B are exchanged.

The p-buffer layer 103 is a layer placed on the lower electrode 102 and having the function of extracting holes from the photoelectric conversion film 104 with good efficiency. Specifically, the p-buffer layer 103 is configured with a p-type photoelectric conversion material, and may be configured with an arylamine, oxazole, an oxadiazole, a triazole, imidazole, a stilbene, a polyarylalkane, a porphyrin, anthracene, fluorenone, a hydrazone, or quinacridone, a derivative of these, or the like. For example, the p-buffer layer 103 may be configured with N,N'-bis(3-methylphenyl)-(1,1'-biphenyl)-4,4'-diamine (TPD), 4,4'-bis[N-naphthyl-N-phenylamino]biphenyl (α-NPD), 4,4',4"-tris(N-(3-methylphenyl)-N-phenylamino)triphenylamine (m-MTDATA), copper tetraphenylporphyrin, phthalocyanine, copper phthalocyanine, or the like.

The photoelectric conversion film 104 is placed on the p-buffer layer 103, and has the function of selectively absorbing green light (for example, light of a wavelength of more than or equal to 450 nm and less than or equal to 600 nm) and photoelectrically converting the absorbed light. In the present embodiment, the photoelectric conversion film 104 contains a subphthalocyanine derivative represented by general formula (1) described above. For example, the photoelectric conversion film 104 may be a bulk hetero-film that contains a subphthalocyanine derivative represented by general formula (1) as an n-type photoelectric conversion material and contains a quinacridone derivative as a p-type photoelectric conversion material.

Further, the photoelectric conversion material contained in the photoelectric conversion film 104 in addition to the subphthalocyanine derivative represented by general formula (1) is not limited to the quinacridone derivative described above. The photoelectric conversion film 104 may contain, for example, a phthalocyanine derivative, a porphyrin derivative, a squarylium derivative, a naphthalene or perylene derivative, a cyanine derivative, a merocyanine derivative, a rhodamine derivative, a diphenylmethane or triphenylmethane derivative, a xanthene derivative, an acridine derivative, a phenoxazine derivative, a quinoline derivative, an oxazole derivative, a thiazole derivative, an oxazine derivative, a thiazine derivative, a benzoquinone derivative, a naphthoquinone derivative, an anthraquinone derivative, an indigo or thioindigo derivative, a pyrrole derivative, a pyridine derivative, a dipirin derivative, an indole derivative, a diketopyrrolopyrrole derivative, a coumarin derivative, a fluorene derivative, a fluoranthene derivative, an anthracene derivative, a pyrene derivative, triarylamine derivatives such as triphenylamine, naphthylamine, and styrylamine, a carbazole derivative, a phenylenediamine derivative, a benzidine derivative, a phenanthroline derivative, an imidazole derivative, an oxazoline derivative, a thiazoline derivative, a triazole derivative, a thiadiazole derivative, an oxadiazole derivative, a thiophene derivative, a selenophene derivative, a silole derivative, a germole derivative, a stilbene derivative, a phenylenevinylene derivative, a pentacene derivative, a rubrene derivative, a thienothiophene derivative, a benzodithiophene derivative, a xanthenoxanthene derivative, or a fullerene derivative as a photoelectric conversion material.

In addition, although the photoelectric conversion film 104 is preferably formed as a bulk hetero-film, the photoelectric conversion film 104 is not limited to a bulk heteromixed film as long as it contains a subphthalocyanine derivative represented by general formula (1), and may be formed of a single-layer film, a planar heterojunction film, etc.

The n-buffer layer 105 is a layer placed on the photoelectric conversion film 104 and having the function of extracting electrons from the photoelectric conversion film 104 with good efficiency. Specifically, the n-buffer layer 105 is configured with an n-type photoelectric conversion material, and may be configured with, for example, fullerenes, carbon nanotubes, an oxadiazole, a triazole compound, an anthraquinodimethane, a diphenylquinone, a distyrylarylene, or a silole compound, a derivative of these, or the like. Specifically, the n-buffer layer 105 may be configured with 1,3-bis(4-tert-butylphenyl-1,3,4-oxadiazolyl)phenylene (OCD-7), bathocuproine, bathophenanthroline, aluminum tris(8-hydroxyquinolinate) (Alq3), or the like.

Here, each layer of the photoelectric conversion element 100 described above may be formed by selecting an appropriate film formation method in accordance with the material, such as vacuum vapor deposition, sputtering, or various coating methods.

Of the layers constituting the photoelectric conversion element 100, the lower electrode 102 and the upper electrode 106 may be formed by, for example, the combination of vapor deposition methods including the electron beam vapor deposition method, the hot filament vapor deposition method, and the vacuum vapor deposition method, the sputtering method, the chemical vapor deposition method (CVD method), and the ion plating method, and the etching method, various printing methods such as the screen printing method, the inkjet printing method, and the metal mask printing method, plating methods (the electroplating method and the electroless plating method), etc.

Further, the layers such as the p-buffer layer 103, the photoelectric conversion film 104, and the n-buffer layer 105 constituting the photoelectric conversion element 100 may be formed by, for example, a vapor deposition method such as the vacuum vapor deposition method, printing methods such as the screen printing method and the inkjet printing method, the laser transfer method, a coating method such as the spin coating method, etc.

In the above, an example of the configuration of the photoelectric conversion element 100 including a photoelectric conversion film according to the present embodiment is described.

[1.3. Examples]

In the following, the subphthalocyanine derivative, the photoelectric conversion film, and the photoelectric conversion element according to the present embodiment are specifically described with reference to Examples and Comparative Examples. In addition, Examples shown below are only examples, and the subphthalocyanine derivative, the photoelectric conversion film, and the photoelectric conversion element according to the present embodiment are not limited to the following examples.

[Simulation Analysis]

First, the light absorption characteristics of the subphthalocyanine derivative represented by general formula (1) were evaluated by simulation analysis. Specifically, simulation analysis was performed on the subphthalocyanine derivatives of the structural formulae shown below, and a maximum absorption wavelength $\lambda_{max}$ was calculated.

In addition, "Bay-6CF$_3$-SubPc," "Bay-3CF$_3$-SubPc," and "Bay-6CF$_2$H-SubPc" are subphthalocyanine derivatives represented by general formula (1), and "SubPc," "Bay-6CH$_2$F-SubPc," and "6CF$_3$-SubPc" are subphthalocyanine derivatives according to Comparative Examples.

[Chem. 6]

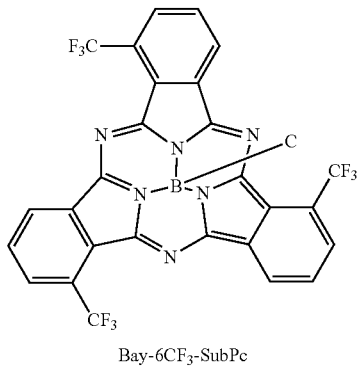

Bay-6CF$_3$-SubPc

Bay-3CF$_3$-SubPc

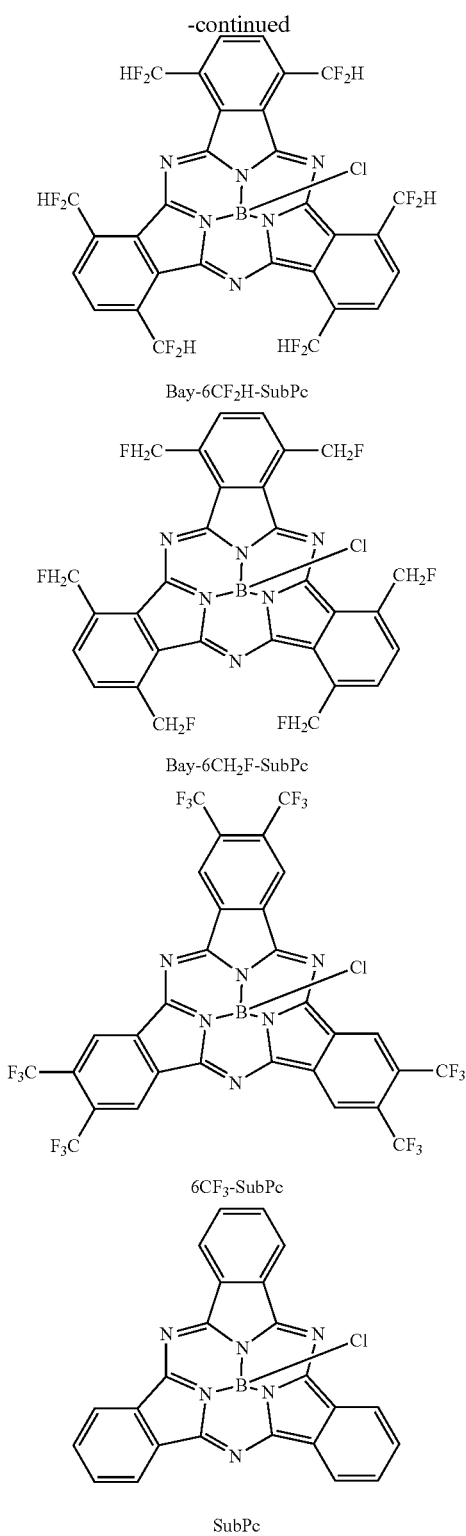

Bay-6CF₂H-SubPc

Bay-6CH₂F-SubPc

6CF₃-SubPc

SubPc

In addition, the simulation analysis was performed by ultraviolet-visible light absorption spectrum (UV-VIS) calculation using time-dependent density functional theory (TD-DFT). First, structure optimization calculation was executed using Gaussian 09 as a calculation program, using, as a basis function, a function form of "6-31+G" in which polarization functions and diffuse functions were added to a double zeta basis set, and using a B3LYP functional. After the structure optimization, ultraviolet-visible light absorption spectrum calculation was executed using TD-DFT at a B3LYP/6-31+G level, and a maximum absorption wavelength $\lambda_{max}$ was calculated.

The calculated maximum absorption wavelengths $\lambda_{max}$ of the subphthalocyanine derivatives are shown in Table 1 below. Further, the energies of the highest occupied molecular orbital (HOMO) level and the lowest unoccupied molecular orbital (LUMO) level of each subphthalocyanine derivative that were calculated at the same time as the calculation of the maximum absorption wavelength $\lambda_{max}$ are shown as well.

In addition, the maximum absorption wavelength $\lambda_{max}$ of each subphthalocyanine derivative shown in Table 1 is the simulation analysis result in one molecule, and therefore the absolute value thereof does not agree with the maximum absorption wavelength in an absorption spectrum described later that was measured after formation into a thin film. However, as can be seen from the result of the absorption spectrum described later that was measured after thin film formation, the tendency agrees between the simulation analysis result and the actual measurement result, and a relative comparison is possible.

TABLE 1

| | Compound | $\lambda_{max}$ [nm] | HOMO [eV] | LUMO [eV] |
|---|---|---|---|---|
| Example 1 | Bay-6CF₃-SubPc | 488.33 | −6.62 | −3.83 |
| Example 2 | Bay-3CF₃-SubPc | 493.06 | −6.14 | −3.40 |
| Example 3 | Bay-6CF₂H-SubPc | 495.27 | −6.19 | −3.46 |
| Comparative Example 1 | SubPc | 499.51 | −5.59 | −2.89 |
| Comparative Example 2 | Bay-6CH₂F-SubPc | 513.32 | −6.02 | −3.39 |
| Comparative Example 3 | 6CF₃-SubPc | 501.81 | −6.86 | −4.17 |

Referring to the results of Table 1, it can be seen that, in the subphthalocyanine derivatives according to Examples 1 to 3, the maximum absorption wavelength $\lambda_{max}$ is shifted to a short wavelength relative to SubPc (Comparative Example 1), and the absorption of light in a wavelength range of more than 600 nm can be reduced. Further, it can be seen that, in the subphthalocyanine derivatives according to Comparative Examples 2 and 3, the maximum absorption wavelength $\lambda_{max}$ is not shifted to a short wavelength relative to SubPc (Comparative Example 1).

Specifically, in comparison between Examples 1 to 3 and Comparative Example 3, it can be seen that, in Examples 1 to 3, the maximum absorption wavelength $\lambda_{max}$ is shifted to a short wavelength relative to SubPc, due to having a substituent represented by general formula (2) in a Bay position of the subphthalocyanine skeleton. On the other hand, it can be seen that, in Comparative Example 3, the maximum absorption wavelength $\lambda_{max}$ is not shifted to a short wavelength relative to SubPc, due to having a substituent represented by general formula (2) in a position other than the Bay position of the subphthalocyanine skeleton.

Further, in comparison between Examples 1 to 3 and Comparative Example 2, it can be seen that, in Examples 1 to 3, the maximum absorption wavelength $\lambda_{max}$ is shifted to a short wavelength relative to SubPc, because there are two or more fluorine atoms in the substituent represented by general formula (2). On the other hand, it can be seen that, in Comparative Example 2, the maximum absorption wavelength $\lambda_{max}$ is not shifted to a short wavelength relative to SubPc, because there is only one fluorine atom in the substituent represented by general formula (2).

Further, in comparison between Example 1 and Example 3, it can be seen that, since Example 1 has a larger number of fluorine atoms in the substituent represented by general formula (2), Example 1 has a still shorter maximum absorption wavelength $\lambda_{max}$ than Example 3 and is preferable. Furthermore, in comparison between Example 1 and Example 2, it can be seen that, since in Example 1 all of $X_1$ to $X_6$ are substituted with a substituent represented by general formula (2), Example 1 has a still shorter maximum absorption wavelength $\lambda_{max}$ than Example 2 and is preferable.

[Synthesis of Subphthalocyanine Derivative]

Next, a method for synthesizing a subphthalocyanine derivative represented by general formula (1) is described. A subphthalocyanine derivative represented by general formula (1) can be synthesized by the generalized synthesis method expressed by Reaction Formula 1 below. In addition, the synthesis method described below is only an example, and the method for synthesizing a subphthalocyanine derivative represented by general formula (1) is not limited to the following example.

[Chem. 7]

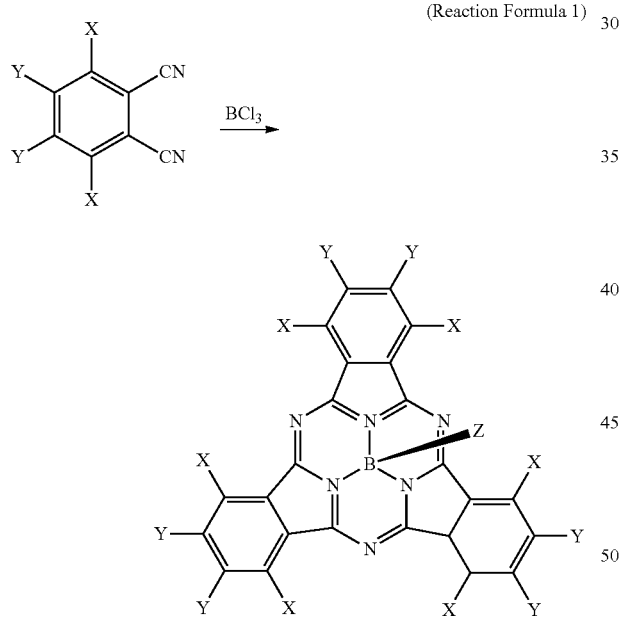

(Reaction Formula 1)

As shown in Reaction Formula 1, a subphthalocyanine derivative can be synthesized by mixing a phthalonitrile derivative and boron trichloride in a solvent and performing heating and reflux. For example, in Reaction Formula 1, Z may be chlorine (Cl), Y may be hydrogen (H), and X may be a trifluoromethyl group ($CF_3$) or hydrogen (H).

Furthermore, a specific method for synthesizing a subphthalocyanine derivative represented by general formula (1) is described by giving specific compounds as examples.

$C_1$—$CF_3$-SubPc and $C_3$—$CF_3$-SubPc of the structural formulae shown below were synthesized by the following method.

[Chem. 8]

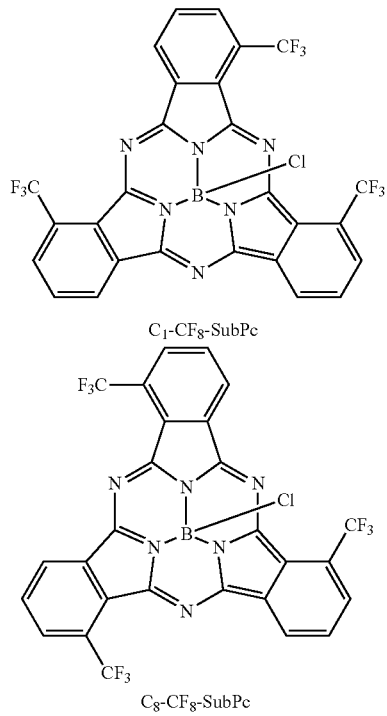

$C_1$-$CF_8$-SubPc $C_8$-$CF_8$-SubPc 3-trifluoromethylphthalonitrile (3 mmol) and boron trichloride (a dichloromethane solution) (1 ml, 1 mmol) were added to a flask, and heating and reflux were performed using 1-chloronaphthalene (3 ml) as the solvent. A Dimroth condenser was connected to a port of the flask, furthermore an upper portion of the Dimroth condenser was led to an exhaust port of a draft by a rubber tube, and thereby low boiling point components were gradually distilled off. The bath temperature of the flask was set to 190° C., and heating and reflux were performed for 3 hours. After the heating and reflux, the mixture was allowed to stand one night, filtration was performed, and furthermore cleaning was performed with dichloromethane. The filtrate was separated and purified by column chromatography, and thereby each of $C_1$—$CF_3$-SubPc (yield: 9%) and $C_3$—$CF_3$-SubPc (yield: 6%) was obtained.

The obtained $C_1$—$CF_3$-SubPc and $C_3$—$CF_3$-SubPc were identified by $^1$H-NMR (nuclear magnetic resonance) and the mass spectrometry method (MS).

[Evaluation of Spectral Characteristics of Subphthalocyanine Derivatives]

Subsequently, the spectral characteristics of the $C_1$—$CF_3$-SubPc and the $C_3$—$CF_3$-SubPc synthesized in the above were evaluated. Specifically, evaluation samples in which the $C_1$—$CF_3$-SubPc and the $C_3$—$CF_3$-SubPc were formed into thin films were prepared, and the spectral characteristics were evaluated.

Example 4

First, UV/ozone treatment was performed on a quartz substrate. The quartz substrate after the treatment was introduced into an organic vapor deposition apparatus, and the $C_1$—$CF_3$-SubPc synthesized in the above was vapor-deposited by the resistance heating method while a substrate holder was rotated in a vacuum at $1\times10^{-5}$ Pa or less; thus, an evaluation sample was prepared. The film thickness of the vapor-deposited $C_1$—$CF_3$-SubPc was 50 nm.

Further, in order to bring the condition close to the state of the actual photoelectric conversion element, indium tin oxide (ITO) was formed as a film with a film thickness of 50 nm by the sputtering method so as to cover the $C_1$—$CF_3$-SubPc layer. Furthermore, in order to find the heat resistance, the evaluation sample after the ITO film formation was subjected to annealing treatment at 160° C. for 5 minutes.

Example 5

An evaluation sample was prepared and ITO film formation and annealing treatment were performed in a similar manner to Example 4 except that $C_3$—$CF_3$-SubPc was used in place of the $C_1$—$CF_3$-SubPc used in Example 4.

Comparative Example 4

An evaluation sample was prepared and ITO film formation and annealing treatment were performed in a similar manner to Example 4 except that the subphthalocyanine chloride (SubPc) shown below was used in place of the $C_1$—$CF_3$-SubPc used in Example 4. In addition, as the subphthalocyanine chloride, a subphthalocyanine chloride purchased from Sigma-Aldrich Co. LLC. was purified by sublimation, and the resulting substance was used.

[Chem. 9]

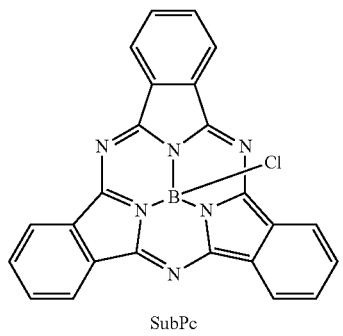

SubPc (Evaluation Results)

For the prepared evaluation samples of Examples 4 and 5 and Comparative Example 4, the change in spectral characteristics between before the ITO film formation (no ITO/annealing not performed), after the ITO film formation (ITO present/annealing not performed), and after the annealing treatment (ITO present/annealing performed) was evaluated using an ultraviolet-visible light spectrophotometer. The results of evaluation of spectral characteristic change of the evaluation samples are shown in FIG. 2A, FIG. 2B, and FIG. 3.

Here, FIG. 2A is a graph showing the results of evaluation of spectral characteristic change of Example 4 ($C_1$—$CF_3$-SubPc), and FIG. 2B is a graph showing the results of evaluation of spectral characteristic change of Example 5 ($C_3$—$CF_3$-SubPc). Further, FIG. 3 is a graph showing the results of evaluation of spectral characteristic change of Comparative Example 4 (SubPc). Further, the maximum absorption wavelengths $\lambda_{max}$ in Examples 4 and 5 and Comparative Example 4 were calculated from the results of FIG. 2A, FIG. 2B, and FIG. 3. The results of the calculated maximum absorption wavelengths $\lambda_{max}$ in Examples 4 and 5 and Comparative Example 4 are shown in Table 2.

TABLE 2

| Compound | | No ITO/ annealing not performed $\lambda_{max}$ [nm] | ITO present/ annealing not performed $\lambda_{max}$ [nm] | ITO present/ annealing performed $\lambda_{max}$ [nm] |
|---|---|---|---|---|
| Example 4 | $C_1$—$CF_3$-SubPc | 564 | 564 | 563 |
| Example 5 | $C_3$—$CF_3$-SubPc | 567 | 567 | 564 |
| Comparative Example 4 | SubPc | 587 | 587 | 587 |

Referring to FIG. 2A and FIG. 2B, it can be seen that Example 4 and Example 5 have little absorption of light in a wavelength range of more than 600 nn, and can selectively absorb green light in the wavelength range of more than or equal to 450 nm and less than or equal to 600 nm. Further, referring to Table 2, it can also be seen that, in Examples 4 and 5, the maximum absorption wavelength $\lambda_{max}$ is hardly changed between before and after the ITO film formation and between before and after the annealing, and heat resistance is provided. On the other hand, referring to FIG. 3, it can be seen that Comparative Example 4 has large absorption of light in a wavelength range of more than 600 nm, and absorbs also red light in the wavelength range of more than 600 nm.

From the above results, it can be seen that subphthalocyanine derivatives represented by general formula (1) have little absorption of light in a wavelength range of more than 600 nn, and can selectively absorb green light in the wavelength range of more than or equal to 450 nm and less than or equal to 600 nm.

[Evaluation of Photoelectric Conversion Efficiency of Subphthalocyanine Derivatives]

Furthermore, photoelectric conversion elements were fabricated by the following fabrication method using the $C_1$—$CF_3$-SubPc and the $C_3$—$CF_3$-SubPc synthesized in the above, and the photoelectric conversion efficiency was evaluated. In addition, the structure and the fabrication method of the photoelectric conversion element described below are only an example, and the structure and the fabrication method of a photoelectric conversion element using a photoelectric conversion film according to the present embodiment are not limited to the following example.

Example 6

First, UV/ozone treatment was performed on a quartz substrate equipped with an ITO electrode. In addition, the film thickness of the ITO electrode (a lower electrode) on the quartz substrate was 50 nm. Next, the quartz substrate after the treatment was introduced into an organic vapor deposition apparatus, and $C_1$—$CF_3$-SubPc and quinacridone were vapor-deposited by the resistance heating method while a substrate holder was rotated in a vacuum at $1 \times 10^{-5}$ Pa or less. In addition, the $C_1$—$CF_3$-SubPc and the quinacridone were vapor-deposited each at a vapor deposition speed of 0.1 nm/second so that the volume ratio of both might be 1:1, and a film of a total of 100 nm was formed; thus, a photoelectric conversion film was formed. Subsequently, AlSiCu was formed as a film with a film thickness of 100 nm on the photoelectric conversion film by the vapor deposition method, and thus an upper electrode was formed. By the above fabrication method, a photoelectric conversion element having a 1 mm×1 mm photoelectric conversion region was fabricated.

In addition, quinacridone is the compound of the structural formula shown below, and a sublimation-purified product purchased from Tokyo Chemical Industry Co., Ltd. was used as the quinacridone.

[Chem. 10]

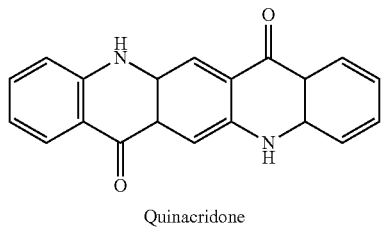

Quinacridone

Example 7

A photoelectric conversion element was fabricated in a similar manner to Example 5 except that $C_3$—$CF_3$-SubPc was used in place of the $C_1$—$CF_3$-SubPc used in Example 5.

(Evaluation Results)

For the fabricated photoelectric conversion elements according to Examples 6 and 7, the photoelectric conversion efficiency before and after annealing treatment was evaluated. The results of evaluation of photoelectric conversion efficiency are shown in Table 3.

The evaluation of photoelectric conversion efficiency was performed by measuring the external quantum efficiency using a semiconductor parameter analyzer. Specifically, the external quantum efficiency was calculated from the light current value and the dark current value in a case where light with an amount of light of 1.62 µW/cm² was applied to the photoelectric conversion element from a light source via a filter and the bias voltage applied between the electrodes was set to −1 V. Such measurement of external quantum efficiency was performed before and after annealing at 160° C. for 5 minutes. Further, in Table 3, "QD" represents quinacridone.

TABLE 3

| | Photoelectric conversion film | External quantum efficiency [%] | |
|---|---|---|---|
| | | Before annealing | After annealing 160° C., 5 min |
| Example 6 | $C_1$—$CF_3$-SubPc/QD | 18 | 38 |
| Example 7 | $C_3$—$CF_3$-SubPc/QD | 18 | 28 |

Referring to the results shown in Table 3, it can be seen that the photoelectric conversion elements according to Examples 6 and 7 have good photoelectric convertibility. Further, it can also be seen that the photoelectric conversion elements according to Examples 6 and 7 have a high external quantum efficiency also after the annealing treatment at 160° C. for 5 minutes, and therefore have heat resistance. Thus, it can be seen that subphthalocyanine derivatives represented by general formula (1) can be suitably used as a photoelectric conversion material.

As can be seen from the above results, it is found that, by containing a subphthalocyanine derivative represented by general formula (1), the photoelectric conversion film according to the present embodiment can reduce the absorption of light in a wavelength range of more than 600 nm and can selectively absorb green light. Thus, the photoelectric conversion film according to the present embodiment can be suitably used for a photoelectric conversion element of green light in a solid state imaging element, and can improve the imaging characteristics of the solid state imaging element.

<2. Examples of Use of Photoelectric Conversion Film According to Present Embodiment>

In the following, examples of the use of the photoelectric conversion element 100 using a photoelectric conversion film according to the present embodiment are described with reference to FIGS. 4 to 6. The photoelectric conversion element 100 according to the present embodiment can be suitably used as an organic photoelectric conversion unit 11G in a solid state imaging element, for example.

[2.1. Solid State Imaging Element]

Figure 4:
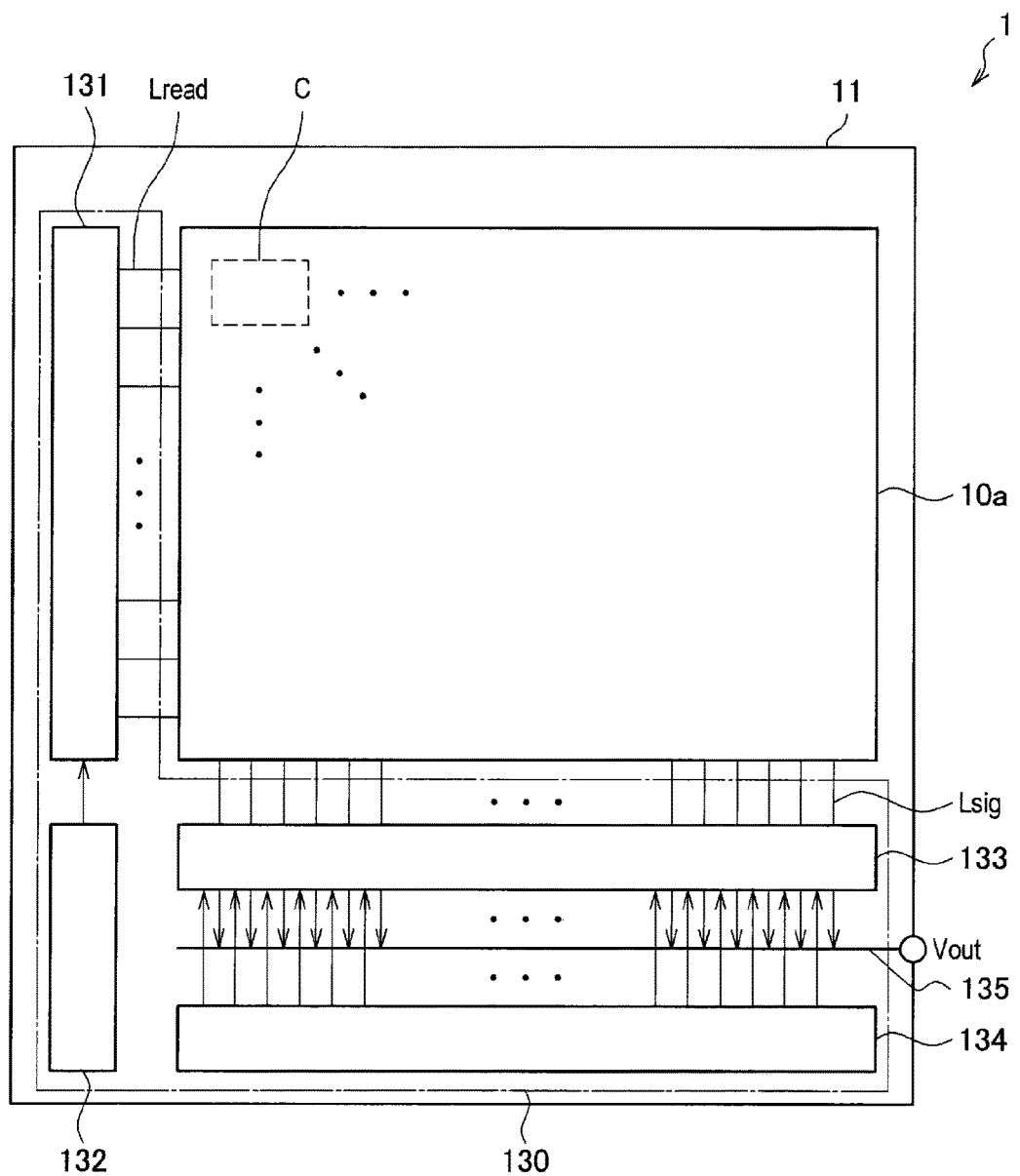
FIG. 4 is a schematic diagram showing the overall configuration of a solid state imaging element using a photoelectric conversion element according to an embodiment of the present invention.

FIG. 4 is a schematic diagram showing the overall configuration of a solid state imaging element 1 using the photoelectric conversion element 100 according to the present embodiment. The solid state imaging element 1 is, for example, a complementary metal oxide semiconductor (CMOS) image sensor. The solid state imaging element 1 includes a pixel unit 10a as an imaging area on a semiconductor substrate 11, and includes, for example, a peripheral circuit unit 130 composed of a row scanning unit 131, a horizontal selection unit 133, a column scanning unit 134, and a system control unit 132 in an area around the pixel unit 10a.

The pixel unit 10a includes, for example, a plurality of unit pixels C that are two-dimensionally arranged in a matrix configuration. In the unit pixel C, for example, a pixel drive line Lread (specifically, a row selection line and a reset control line) is drawn for each pixel row, and a vertical signal line Lsig is drawn for each pixel column. Further, the pixel drive line Lread transmits a drive signal for signal reading from the pixel. In addition, one end of the pixel drive line Lread is, for example, connected to an output end corresponding to each row of the row scanning unit 131.

The row scanning unit 131 is a pixel drive unit that is configured with a shift register, an address decoder, etc. and drives each unit pixel C of the pixel unit 10a, for example in units of rows. A signal outputted from each unit pixel C of a pixel row that is selectively scanned by the row scanning unit 131 is supplied to the horizontal selection unit 133 through each vertical signal line Lsig. In addition, the horizontal selection unit 133 is configured with an amplifier, a horizontal selection switch, etc. provided for each vertical signal line Lsig.

The column scanning unit 134 is configured with a shift register, an address decoder, etc., and scans each horizontal selection switch of the horizontal selection unit 133 and causes each part of the horizontal selection unit 133 to be driven one after another. By the selective scanning by the column scanning unit 134, signals of the pixels transmitted through the vertical signal lines Lsig are sequentially outputted to a horizontal signal line (not illustrated), and are transmitted to the outside of the semiconductor substrate 11 through the horizontal signal line.

In addition, the circuit portion composed of the row scanning unit 131, the horizontal selection unit 133, the column scanning unit 134, and the horizontal signal line may be formed directly on the semiconductor substrate 11, or may be provided in an external control IC. Further, the circuit portion may be formed on another substrate connected by a cable or the like.

The system control unit 132 receives a clock, data that provide the instruction of the operating mode, etc. given from the outside of the semiconductor substrate 11. Further, the system control unit 132 outputs data such as the inside information of the solid state imaging element 1. Furthermore, the system control unit 132 includes a timing generator that generates various timing signals, and performs the drive control of peripheral circuits such as the row scanning unit 131, the horizontal selection unit 133, and the column scanning unit 134 on the basis of the timing signal generated by the timing generator.

Next, the configuration that each pixel in the solid state imaging element 1 described above has is described with reference to FIG. 5. FIG. 5 is a cross-sectional view of the configuration of one pixel 10a1 near the boundary between the pixel unit 10a and a peripheral unit 10b of the pixel unit 10a taken along the thickness direction of the substrate.

Figure 5:
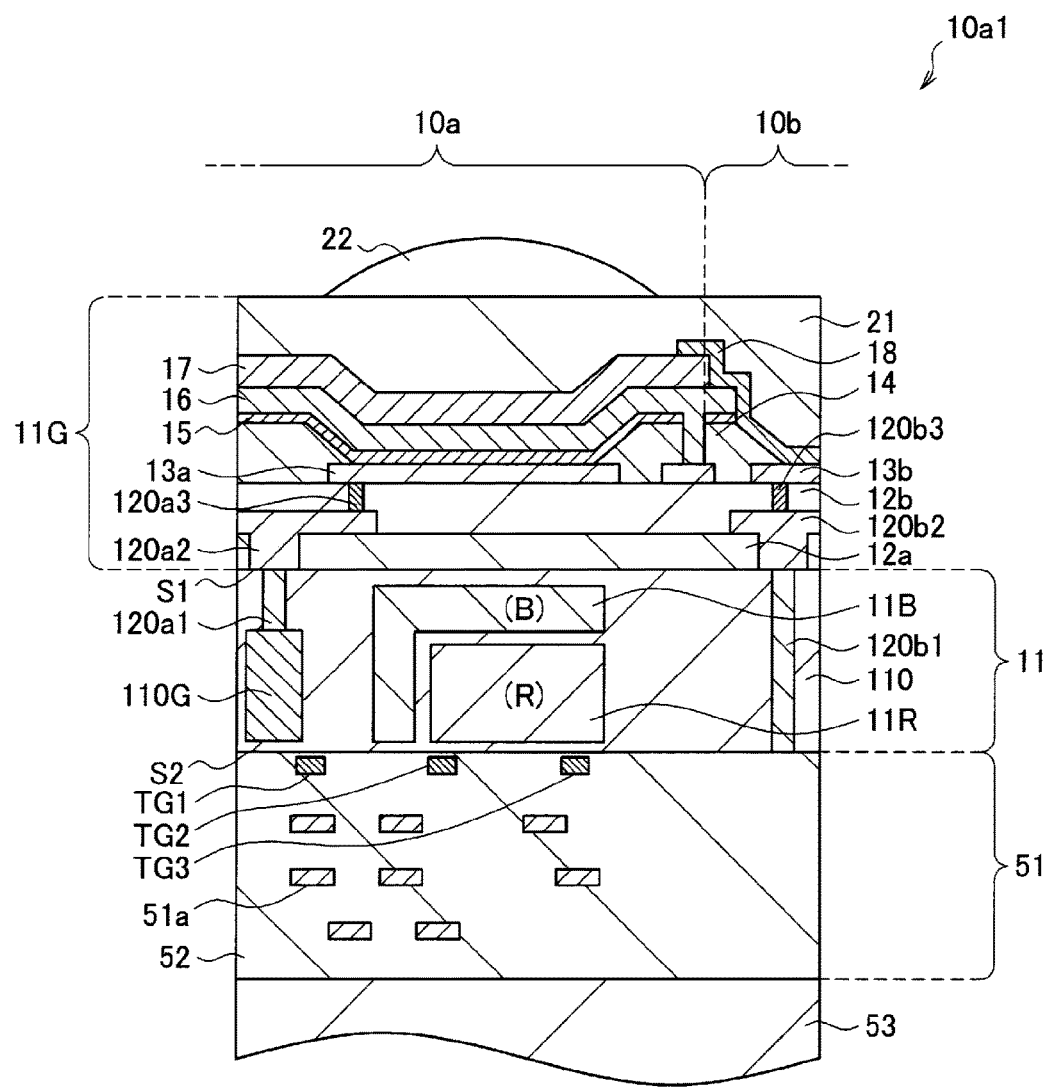
FIG. 5 is a cross-sectional view of the configuration of one pixel near the boundary between a pixel unit and a peripheral unit of the pixel unit of FIG. 4 taken along the thickness direction of a substrate.

As shown in FIG. 5, the solid state imaging element 1 is an imaging element of a structure that includes pixel transistors (including transfer transistors Tr1 to Tr3 described later) and includes a multilayer interconnection layer 51 on the front surface (a surface S2 on the opposite side to the light receiving surface) side of the semiconductor substrate 11 (what is called a back-side illumination structure).

The pixel 10a1 has a structure in which an organic photoelectric conversion unit and inorganic photoelectric conversion units that selectively detect light in mutually different wavelength ranges and perform photoelectric conversion are stacked in the vertical direction. Thereby, the solid state imaging element 1 can acquire a plurality of kinds of color signals for each pixel without using a color filter.

FIG. 5 shows a pixel 10a1 that has a stacked structure of one organic photoelectric conversion unit 11G and two inorganic photoelectric conversion units 11B and 11R and thereby acquires a color signal of each of red (R), green (G), and blue (B). Specifically, in FIG. 5, the organic photoelectric conversion unit 11G is formed on the back surface (surface 51) of the semiconductor substrate 11, and the inorganic photoelectric conversion units 11B and 11R are formed to be embedded in the semiconductor substrate 11. In the following, the configuration of each part is described.

(Semiconductor Substrate)

The semiconductor substrate 11 includes, for example, an n-type silicon (Si) layer 110, and the inorganic photoelectric conversion units 11B and 11R and an electricity storage layer for green 110G are formed to be embedded in a prescribed region of the silicon layer 110. Further, electrically conductive plugs 120a1 and 120b1 serving as a transfer path of a charge (electrons or holes) from the organic photoelectric conversion unit 11G are buried in the semiconductor substrate 11.

That is, in the pixel 10a1, the back surface (surface 51) of the semiconductor substrate 11 serves as a light receiving surface. On the front surface (surface S2) side of the semiconductor substrate 11, a plurality of pixel transistors (including transfer transistors Tr1 to Tr3) corresponding to the organic photoelectric conversion unit 11G and the inorganic photoelectric conversion units 11B and 11R, respectively, are formed, and furthermore a peripheral circuit formed of a logic circuit etc. is formed.

The pixel transistors include, for example, transfer transistors Tr1 to Tr3, a reset transistor, an amplifying transistor, a selection transistor, etc. These pixel transistors are configured with, for example, a MOS transistor or the like, and are formed in a p-type semiconductor well region on the surface S2 side. A circuit including such pixel transistors is formed for each of the red, green, and blue photoelectric conversion units. Each of these circuits may be, for example, a three-transistor configuration including a transfer transistor, a reset transistor, and an amplifying transistor, or may be a four-transistor configuration further including a selection transistor.

In FIG. 5, among these pixel transistors, only the transfer transistors Tr1 to Tr3 are shown and described. Further, pixel transistors other than the transfer transistors Tr1 to Tr3 may be shared between photoelectric conversion units or between pixels. Further, it is also possible to use a structure in which a floating diffusion is shared (what is called a pixel shared structure).

The transfer transistors Tr1 to Tr3 are configured to include a gate electrode (gate electrodes TG1 to TG3) and a floating diffusion (not illustrated). Of these, the gate electrodes TG1 to TG3 are formed in the multilayer interconnection layer 51, and the floating diffusion is formed in the semiconductor substrate 11.

The transfer transistor Tr1 transfers a signal charge that is generated in the organic photoelectric conversion unit 11G and stored in the electricity storage layer for green 110G (a charge corresponding to green color) to the vertical signal line Lsig described later. The transfer transistor Tr2 transfers a signal charge generated and stored in the inorganic photoelectric conversion unit 11B (a charge corresponding to blue color) to the vertical signal line Lsig described later. Similarly, the transfer transistor Tr3 transfers a signal charge generated and stored in the inorganic photoelectric conversion unit 11R (a charge corresponding to red color) to the vertical signal line Lsig described later.

Each of the inorganic photoelectric conversion units 11B and 11R is a photodiode having a p-n junction. For the inorganic photoelectric conversion units 11B and 11R, the inorganic photoelectric conversion unit 11B and the inorganic photoelectric conversion unit 11R are formed in this order from the surface 51 side on the optical path in the semiconductor substrate 11.

The inorganic photoelectric conversion unit 11B selectively detects blue light, and stores a signal charge corresponding to blue color. The inorganic photoelectric conversion unit 11B is, for example, formed to extend from a selective area along the surface 51 of the semiconductor substrate 11 to an area near the interface with the multilayer interconnection layer 51. The inorganic photoelectric conversion unit 11R selectively detects red light, and stores a signal charge corresponding to red color. The inorganic photoelectric conversion unit 11R is, for example, formed over an area below the inorganic photoelectric conversion unit 11B (the surface S2 side).

In addition, the blue color (B) is a color corresponding to, for example, the wavelength range of more than or equal to 400 nm and less than 450 nm, and the red color (R) is a color corresponding to, for example, the wavelength range of more than or equal to 600 nm and less than 750 nm. It is sufficient for each of the inorganic photoelectric conversion units 11B and 11R to be capable of detecting light in at least a partial wavelength range of each wavelength range.

The electricity storage layer for green 110G is, for example, configured to include an n-type region serving as an electron storage layer. A part of the n-type region is connected to the electrically conductive plug 120a1, and can store electrons transferred from the side of a lower electrode 13a via the electrically conductive plug 120a1.

The electrically conductive plugs 120a1 and 120b1, along with electrically conductive plugs 120a2 and 120b2, function as a connector between the organic photoelectric conversion unit 11G and the semiconductor substrate 11, and further serve as a transfer path of electrons or holes generated in the organic photoelectric conversion unit 11G. In FIG. 5, the electrically conductive plug 120a1 is connected with conduction to the lower electrode 13a of the organic photoelectric conversion unit 11G, and is connected to the electricity storage layer for green 110G. Further, the electrically conductive plug 120b1 is connected with conduction to an upper electrode 16 of the organic photoelectric conversion unit 11G, and serves as an interconnection for releasing holes.

The electrically conductive plugs 120a1 and 120b1 may be formed by, for example, an electrically conductive film material such as tungsten being buried in a through via. In such a case, for example, in order to suppress a short circuit between silicon and the through via, it is preferable that the side surface of the via be covered with an insulating film of silicon oxide ($SiO_2$), silicon nitride (SiN), or the like. Alternatively, the electrically conductive plugs 120a1 and 120b1 may be formed by embedding an electrically conductive semiconductor layer. In such a case, the electrically conductive plug 120a1 serves as a transfer path of electrons and is hence preferably formed as an n-type, and the electrically conductive plug 120b1 serves as a transfer path of holes and is hence preferably formed as a p-type.

(Multilayer Interconnection Layer)

The multilayer interconnection layer 51 is formed on the surface S2 of the semiconductor substrate 11. A plurality of interconnections 51a are arranged in the multilayer interconnection layer 51 via an interlayer insulating film 52. Thus, in the pixel 10al, the multilayer interconnection layer 51 is formed on the opposite side to the light receiving surface, and what is called a back-side illumination solid state imaging element is formed. A support substrate 53 made of silicon may be stuck to the multilayer interconnection layer 51, for example.

(Organic Photoelectric Conversion Unit)

The organic photoelectric conversion unit 11G is an organic photoelectric conversion element that, by means of an organic compound, absorbs light in a selective wavelength range (herein, green light corresponding to the wavelength range of more than or equal to 450 nm and less than or equal to 600 nm) and generates electron-hole pairs. The organic photoelectric conversion unit 11G has a configuration in which an organic photoelectric conversion film 15 is sandwiched by a pair of electrodes for extracting a signal charge (the lower electrode 13a and the upper electrode 16). The lower electrode 13a and the upper electrode 16 are electrically connected to the electrically conductive plugs 120a1 and 120b1 buried in the semiconductor substrate 11 via an interconnection layer and a contact metal layer.

Specifically, in the organic photoelectric conversion unit 11G, interlayer insulating films 12a and 12b are formed on the surface 51 of the semiconductor substrate 11. In the interlayer insulating film 12a, through holes are provided in regions corresponding to the electrically conductive plugs 120a1 and 120b1, respectively, and the electrically conductive plugs 120a2 and 120b2 are buried in the respective through holes. Further, in the interlayer insulating film 12b, electrically conductive plugs 120a3 and 120b3 are buried in regions corresponding to the electrically conductive plugs 120a2 and 120b2, respectively.

Further, on the interlayer insulating film 12b, the lower electrode 13a is provided, and an interconnection layer 13b that is electrically isolated from the lower electrode 13a by an insulating film 14 is provided. Furthermore, the organic photoelectric conversion film 15 is formed on the lower electrode 13a, and the upper electrode 16 and a sealing film 17 are formed so as to cover the organic photoelectric conversion film 15. In addition, a contact metal layer 18 is formed so as to be electrically connected to the upper electrode 16 and the electrically conductive plug 120b3.

The electrically conductive plugs 120a2 and 120a3, along with the electrically conductive plug 120a1, function as a connector, and form a transfer path of a charge (electrons) from the lower electrode 13a to the electricity storage layer for green 110G. Further, the electrically conductive plugs 120b2 and 120b3, along with the electrically conductive plug 120b1, function as a connector, and form a release path of a charge (holes) from the upper electrode 16 via the interconnection layer 13b and the contact metal layer 18.

In addition, the electrically conductive plugs 120a2 and 120b2 are preferably configured by a stacked film of, for example, metal materials such as titanium (Ti), titanium nitride (TiN), and tungsten so as to function also as a light blocking film. Further, by using such a stacked film, the contact with silicon can be ensured even in a case where the electrically conductive plugs 120a1 and 120b1 are formed as an n-type or p-type semiconductor layer.

The lower electrode 13a immediately faces the light receiving surfaces of the inorganic photoelectric conversion units 11B and 11R formed in the semiconductor substrate 11, and is provided in an area covering these light receiving surfaces. On the other hand, the upper electrode 16 may be provided common to pixels.

Here, a flattening film 21 is formed on the sealing film 17 and the contact metal layer 18 so as to cover the entire surface. Further, an on-chip lens 22 (for example, a microlens) is provided on the flattening film 21. The on-chip lens 22 collects the light incident from above to each of the light receiving surfaces of the organic photoelectric conversion unit 11G and the inorganic photoelectric conversion units 11B and 11R.

In FIG. 5, the multilayer interconnection layer 51 is formed on the surface S2 side of the semiconductor substrate 11, and therefore the light receiving surfaces of the organic photoelectric conversion unit 11G and the inorganic photoelectric conversion units 11B and 11R can be arranged close to each other. Thereby, the variation in sensitivity between colors occurring in dependence on the F-number of the on-chip lens 22 can be reduced.

In the solid state imaging element 1 like that described above, a light receiving signal is acquired in the following manner, for example.

Of the light L incident on the pixel 10al, first, green light $L_g$ is selectively detected (absorbed) and photoelectrically converted in the organic photoelectric conversion unit 11G. Thereby, of the generated electron-hole pair, the electron is extracted from the lower electrode 13a side, and is stored in the electricity storage layer for green 110G via the electrically conductive plugs 120a1 to 120a3. During the reading operation, the stored electron is read to the vertical signal line Lsig via pixel transistors (not illustrated). In addition, the hole is released from the upper electrode 16 side via the contact metal layer 18, the interconnection layer 13b, and the electrically conductive plugs 120b1 to 120b3.

Subsequently, of the light transmitted through the organic photoelectric conversion unit 11G, blue light $L_b$ and red light $L_r$ are sequentially absorbed and photoelectrically converted in the inorganic photoelectric conversion unit 11B and the inorganic photoelectric conversion unit 11R, respectively. In the inorganic photoelectric conversion unit 11B, electrons corresponding to the incident blue light $L_b$ are stored in an n-type region (not illustrated). During the reading operation, the stored electron is read to the vertical signal line Lsig via pixel transistors (not illustrated). In addition, the hole is stored in a p-type region (not illustrated). Similarly, in the inorganic photoelectric conversion unit 11R, electrons corresponding to the incident red light $L_r$ are stored in an n-type region (not illustrated). During the reading operation, the stored electron is read to the vertical signal line Lsig via pixel transistors (not illustrated). In addition, the hole is stored in a p-type region (not illustrated).

Thus, by stacking the organic photoelectric conversion unit 11G and the inorganic photoelectric conversion units 11B and 11R in the vertical direction, red color, green color, and blue color can be separated and detected, and a signal charge of each color can be obtained, without providing a color filter.

[2.2. Electronic Device]

The solid state imaging element 1 described above can be used for, for example, all types of electronic devices having an imaging function, such as camera systems such as digital still cameras or video cameras and mobile phones having an imaging function. FIG. 6 shows a rough configuration of such an electronic device. FIG. 6 is a schematic diagram describing the configuration of an electronic device according to the present embodiment.

Figure 6:
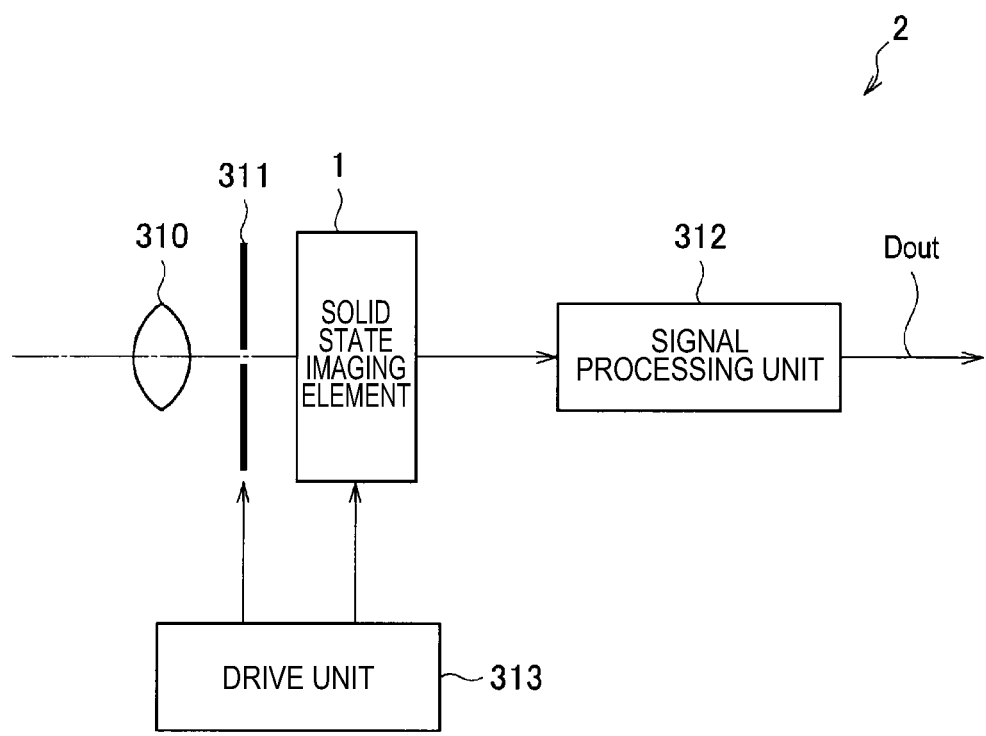
FIG. 6 is a schematic diagram describing the configuration of an electronic device according to an embodiment of the present invention.

As shown in FIG. 6, an electronic device 2 is, for example, a video camera capable of photographing a still image or a moving image, and includes the solid state imaging element 1, an optical system 310, a shutter device 311, a drive unit 313 that causes the solid state imaging element 1 and the shutter device 311 to be driven, and a signal processing unit 312.

The optical system 310 is, for example, an optical lens, and guides image light (incident light) from a subject to the pixel unit 10a of the solid state imaging element 1. In addition, the optical system 310 may be configured of a plurality of optical lenses. The shutter device 311 controls the light irradiation period and the light blocking period to the solid state imaging element 1. Further, the drive unit 313 controls the transfer operation of the solid state imaging element 1 and the shutter operation of the shutter device 311. The signal processing unit 312 performs various pieces of signal processing on a signal outputted from the solid state imaging element 1. A video image signal Dout after the signal processing may be stored in a storage medium such as a memory, or may be outputted to a monitor or the like, for example.

In addition, although in the above embodiment a configuration in which the organic photoelectric conversion unit 11G that detects green light and the inorganic photoelectric conversion units 11B and 11R that detect blue light and red light, respectively, are stacked is given as an example of the solid state imaging element 1, the present technology is not limited to the above example.

For example, it is also possible to provide an organic photoelectric conversion unit including organic photoelectric conversion films that detect blue light and red light, respectively, in place of the inorganic photoelectric conversion units 11B and 11R that detect blue light and red light, respectively. Further, instead of the structure in which an organic photoelectric conversion unit and an inorganic photoelectric conversion unit are stacked in the vertical direction, a structure in which an organic photoelectric conversion unit and an inorganic photoelectric conversion unit are provided side by side along the surface of a substrate may be employed.

Further, although in the above embodiment the configuration of a back-side illumination solid state imaging element is given as an example, the technology according to the present disclosure can be applied also to a front-side illumination solid state imaging element.

<3. Conclusions>

As described above, by containing a subphthalocyanine derivative represented by general formula (1), the photoelectric conversion film according to the present embodiment can reduce the absorption of light in a wavelength range of more than 600 nm. Therefore, the photoelectric conversion film according to the present embodiment can selectively absorb green light in the wavelength range of more than or equal to 450 nm and less than or equal to 600 nm. Thus, the photoelectric conversion film according to the present embodiment can be suitably used for a photoelectric conversion element of green light in a solid state imaging element, and can improve the imaging characteristics of the solid state imaging element.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A photoelectric conversion film including a subphthalocyanine derivative represented by general formula (1) below,

[Chem. 11]

general formula (1)

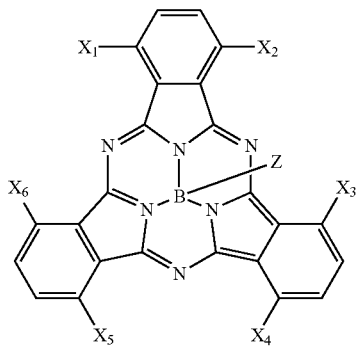

in which, in the general formula (1), $X_1$ to $X_6$ are mutually independently hydrogen, a halogen, a hydroxy group, a thiol group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, or a substituted or unsubstituted heteroaryl group, Z is hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom, and at least one or more of the $X_1$ and the $X_2$, at least one or more of the $X_3$ and the $X_4$, and at least one or more of the $X_5$ and the $X_6$ are a substituent represented by general formula (2) below,

[Chem. 12]

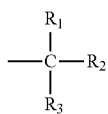

general formula (2)

in which, in the general formula (2), $R_1$ to $R_3$ are mutually independently hydrogen, a halogen, a hydroxy group, an alkoxy group, a cyano group, a nitro group, a sulfonyl group, an amino group, an acyl group, a carboxy group, or a substituted or unsubstituted alkyl group, and at least two or more of the $R_1$ to the $R_3$ are fluorine.

(2) The photoelectric conversion film according to (1), in which the $X_1$ to the $X_6$ are mutually independently a substituent represented by the general formula (2).

(3) The photoelectric conversion film according to (1) or (2), in which the substituent represented by the general formula (2) is a difluoromethyl group or a trifluoromethyl group.

(4) The photoelectric conversion film according to any one of (1) to (3), in which the Z is a halogen, a hydroxy group, or a substituted or unsubstituted alkoxy group.

(5) The photoelectric conversion film according to any one of (1) to (4), in which the photoelectric conversion film is formed as a bulk hetero-film.

(6) A solid state imaging element including:
a photoelectric conversion film containing a subphthalocyanine derivative represented by general formula (1) below,

[Chem. 13]

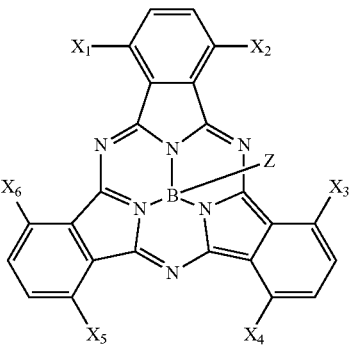

general formula (1)

in which, in the general formula (1), $X_1$ to $X_6$ are mutually independently hydrogen, a halogen, a hydroxy group, a thiol group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, or a substituted or unsubstituted heteroaryl group, Z is hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom, and at least one or more of the $X_1$ and the $X_2$, at least one or more of the $X_3$ and the $X_4$, and at least one or more of the $X_5$ and the $X_6$ are a substituent represented by general formula (2) below,

[Chem. 14]

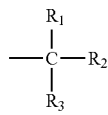

general formula (2)

in which, in the general formula (2), $R_1$ to $R_3$ are mutually independently hydrogen, a halogen, a hydroxy group, an alkoxy group, a cyano group, a nitro group, a sulfonyl group, an amino group, an acyl group, a carboxy group, or a substituted or unsubstituted alkyl group, and at least two or more of the $R_1$ to the $R_3$ are fluorine.

(7)

The solid state imaging element according to (6), in which the photoelectric conversion film absorbs green light of a wavelength of more than or equal to 450 nm and less than or equal to 600 nm and photoelectrically converts the absorbed green light.

(8)

The solid state imaging element according to (6) or (7), in which the solid state imaging element is configured as a stacked solid state imaging element in which a plurality of photoelectric conversion films including the photoelectric conversion film are stacked.

(9)

An electronic device including:

a solid state imaging element including a photoelectric conversion film containing a subphthalocyanine derivative represented by general formula (1) below;

an optical system configured to guide incident light to the solid state imaging element; and an arithmetic processing circuit configured to arithmetically process an output signal from the solid state imaging element,

[Chem. 15]

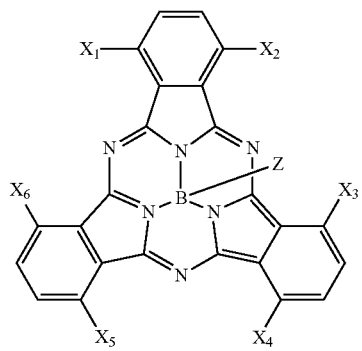

general formula (1)

in which, in the general formula (1), $X_1$ to $X_6$ are mutually independently hydrogen, a halogen, a hydroxy group, a thiol group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, or a substituted or unsubstituted heteroaryl group, Z is hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom, and at least one or more of the $X_1$ and the $X_2$, at least one or more of the $X_3$ and the $X_4$, and at least one or more of the $X_5$ and the $X_6$ are a substituent represented by general formula (2) below,

[Chem. 16]

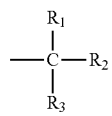

general formula (2)

in which, in the general formula (2), $R_1$ to $R_3$ are mutually independently hydrogen, a halogen, a hydroxy group, an alkoxy group, a cyano group, a nitro group, a sulfonyl group, an amino group, an acyl group, a carboxy group, or a substituted or unsubstituted alkyl group, and at least two or more of the $R_1$ to the $R_3$ are fluorine.

REFERENCE SIGNS LIST 100 photoelectric conversion element
101 substrate
102 lower electrode
103 p-buffer layer
104 photoelectric conversion film
105 n-buffer layer
106 upper electrode

The invention claimed is:

1. A photoelectric conversion film, comprising:
a subphthalocyanine derivative represented by general formula (1) below,

[Chem. 1]

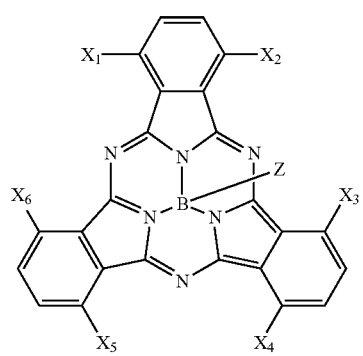

general formula (1)

wherein, in the general formula (1),
$X_1$ to $X_6$ are mutually independently hydrogen, a halogen, a hydroxy group, a thiol group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, or a substituted or unsubstituted heteroaryl group, Z is hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom, and at least one or more of the $X_1$ and the $X_2$, at least one or more of the $X_3$ and the $X_4$, and at least one or more of the $X_5$ and the $X_6$ are a substituent represented by general formula (2) below,

[Chem. 2]

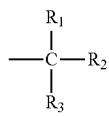

general formula (2)

wherein, in the general formula (2), $R_1$ to $R_3$ are mutually independently hydrogen, a halogen, a hydroxy group, an alkoxy group, a cyano group, a nitro group, a sulfonyl group, an amino group, an acyl group, a carboxy group, or a substituted or unsubstituted alkyl group, and at least two or more of the $R_1$ to the $R_3$ are fluorine.

2. The photoelectric conversion film according to claim 1, wherein the $X_1$ to the $X_6$ are mutually independently the substituent represented by the general formula (2).

3. The photoelectric conversion film according to claim 1, wherein the substituent represented by the general formula (2) is a difluoromethyl group or a trifluoromethyl group.

4. The photoelectric conversion film according to claim 1, wherein the Z is a halogen, a hydroxy group, or a substituted or unsubstituted alkoxy group.

5. The photoelectric conversion film according to claim 1, wherein the photoelectric conversion film is formed as a bulk hetero-film.

6. A solid state imaging element, comprising:

a photoelectric conversion film containing a subphthalocyanine derivative represented by general formula (1) below,

[Chem. 3]

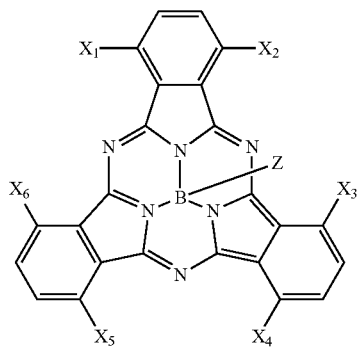

general formula (1)

wherein, in the general formula (1), $X_1$ to $X_6$ are mutually independently hydrogen, a halogen, a hydroxy group, a thiol group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, or a substituted or unsubstituted heteroaryl group, Z is hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom, and at least one or more of the $X_1$ and the $X_2$, at least one or more of the $X_3$ and the $X_4$, and at least one or more of the $X_5$ and the $X_6$ are a substituent represented by general formula (2) below,

[Chem. 4]

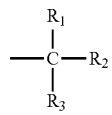

general formula (2)

wherein, in the general formula (2), $R_1$ to $R_3$ are mutually independently hydrogen, a halogen, a hydroxy group, an alkoxy group, a cyano group, a nitro group, a sulfonyl group, an amino group, an acyl group, a carboxy group, or a substituted or unsubstituted alkyl group, and at least two or more of the $R_1$ to the $R_3$ are fluorine.

7. The solid state imaging element according to claim 6, wherein the photoelectric conversion film absorbs green light of a wavelength of more than or equal to 450 nm and less than or equal to 600 nm and photoelectrically converts the absorbed green light.

8. The solid state imaging element according to claim 7, wherein the solid state imaging element is configured as a stacked solid state imaging element in which a plurality of photoelectric conversion films including the photoelectric conversion film are stacked.

9. An electronic device, comprising:
a solid state imaging element including a photoelectric conversion film containing a subphthalocyanine derivative represented by general formula (1) below;
an optical system configured to guide incident light to the solid state imaging element; and
an arithmetic processing circuit configured to arithmetically process an output signal from the solid state imaging element,

[Chem. 5]

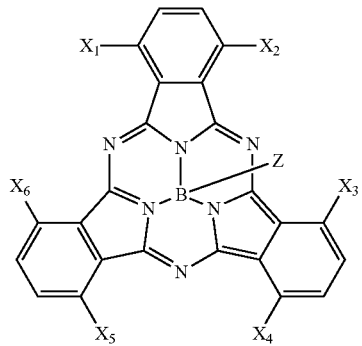

general formula (1)

wherein, in the general formula (1),
$X_1$ to $X_6$ are mutually independently hydrogen, a halogen, a hydroxy group, a thiol group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, or a substituted or unsubstituted heteroaryl group, Z is hydrogen, a halogen, a hydroxy group, a thiol group, an imide group, an alkoxy group, a cyano group, a nitro group, a silylalkyl group, a silylalkoxy group, an arylsilyl group, a thioalkyl group, a thioaryl group, a sulfonyl group, an arylsulfonyl group, an alkylsulfonyl group, an amino group, an alkylamino group, an arylamino group, an acyl group, an acylamino group, an acyloxy group, a carboxy group, a carboxamide group, a carboalkoxy group, a substituted or unsubstituted alkyl group, a substituted or unsubstituted cycloalkyl group, a substituted or unsubstituted aryl group, a substituted or unsubstituted heteroaryl group, a substituted or unsubstituted alkylthio group, a substituted or unsubstituted arylthio group, or a subphthalocyanine derivative linked via an oxygen atom, and at least one or more of the $X_1$ and the $X_2$, at least one or more of the $X_3$ and the $X_4$, and at least one or more of the $X_5$ and the $X_6$ are a substituent represented by general formula (2) below,

[Chem. 6]

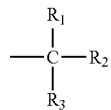

general formula (2)

wherein, in the general formula (2),
$R_1$ to $R_3$ are mutually independently hydrogen, a halogen, a hydroxy group, an alkoxy group, a cyano group, a nitro group, a sulfonyl group, an amino group, an acyl group, a carboxy group, or a substituted or unsubstituted alkyl group, and
at least two or more of the $R_1$ to the $R_3$ are fluorine.

* * * * *